(12) United States Patent
Khakifirooz et al.

(10) Patent No.: US 8,592,916 B2
(45) Date of Patent: Nov. 26, 2013

(54) SELECTIVELY RAISED SOURCE/DRAIN TRANSISTOR

(75) Inventors: Ali Khakifirooz, Mountain View, CA (US); Thomas N. Adam, Slingerlands, NY (US); Kangguo Cheng, Schenectady, NY (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 13/424,787

(22) Filed: Mar. 20, 2012

(65) Prior Publication Data

US 2013/0249006 A1   Sep. 26, 2013

(51) Int. Cl.
*H01L 21/02* (2006.01)
(52) U.S. Cl.
USPC .......... 257/382; 257/353; 257/E29.121; 257/E21.507; 438/300
(58) Field of Classification Search
USPC .......... 257/382, 353, E29.121, E21.507; 438/300
See application file for complete search history.

(56) References Cited

U.S. PATENT DOCUMENTS

| | | | |
|---|---|---|---|
| 7,176,109 B2 | 2/2007 | Ping et al. | |
| 7,176,110 B2 | 2/2007 | van Bentum et al. | |
| 7,405,968 B2 | 7/2008 | Mokhlesi et al. | |
| 7,550,343 B2 | 6/2009 | Wasshuber | |
| 7,572,715 B2 | 8/2009 | Kim et al. | |
| 7,592,619 B2 | 9/2009 | Tsai et al. | |
| 7,736,982 B2 | 6/2010 | Liao et al. | |
| 8,012,840 B2 | 9/2011 | Ando | |
| 8,022,488 B2 | 9/2011 | Cheng et al. | |
| 8,030,708 B2 | 10/2011 | Tateshita | |
| 8,395,217 B1* | 3/2013 | Cheng et al. | 257/350 |
| 2002/0001891 A1 | 1/2002 | Kim et al. | |
| 2007/0090466 A1 | 4/2007 | Park et al. | |
| 2011/0201164 A1 | 8/2011 | Chung et al. | |

* cited by examiner

*Primary Examiner* — Tu-Tu Ho
(74) *Attorney, Agent, or Firm* — Scully, Scott, Murphy & Presser, P.C.; Wenjie Li

(57) ABSTRACT

A lower raised source/drain region is formed on a planar source/drain region of a planar field effect transistor or a surface of a portion of semiconductor fin adjoining a channel region of a fin field effect transistor. At least one contact-level dielectric material layer is formed and planarized, and a contact via hole extending to the lower raised source/drain region is formed in the at least one contact-level dielectric material layer. An upper raised source/drain region is formed on a top surface of the lower raised source/drain region. A metal semiconductor alloy portion and a contact via structure are formed within the contact via hole. Formation of the upper raised source/drain region is limited to a bottom portion of the contact via hole, thereby preventing formation of, and increase of parasitic capacitance by, any additional raised structure in source/drain regions that are not contacted.

20 Claims, 21 Drawing Sheets

SELECTIVELY RAISED SOURCE/DRAIN TRANSISTOR

BACKGROUND

The present disclosure generally relates to semiconductor devices, and particularly to semiconductor devices including at least one selectively raised source/drain region that is laterally confined to an area of a contact via structure, and methods of manufacturing the same.

A raised source/drain region collectively refers to a class of regions including a raised source region and a raised drain region. A raised source region is a semiconductor region that is deposited on a semiconductor region of a field effect transistor and functions as a part of a source region of the field effect transistor. A raised drain region is a semiconductor region that is deposited on a semiconductor region of a field effect transistor and functions as a part of a drain region of the field effect transistor. A raised source/drain region can be formed on a pre-existing source/drain region by a selective deposition process, which deposits a semiconductor material only on semiconductor surfaces and does not deposit any semiconductor material on a dielectric surface.

A raised source/drain region in a field effect transistor provides various advantages in device characteristics including reduction of source and drain parasitic resistance. However, one of the disadvantages of the raised source/drain structure is an increase in the parasitic capacitance between the raised source/drain structure and the gate electrode of the field effect transistor.

BRIEF SUMMARY

A lower raised source/drain region is formed on a planar source/drain region of a planar field effect transistor or a surface of a portion of semiconductor fin adjoining a channel region of a fin field effect transistor. At least one contact-level dielectric material layer is formed and planarized, and a contact via hole extending to the lower raised source/drain region is formed in the at least one contact-level dielectric material layer. An upper raised source/drain region is formed on a top surface of the lower raised source/drain region. A metal semiconductor alloy portion and a contact via structure are formed within the contact via hole. Formation of the upper raised source/drain region is limited to a bottom portion of the contact via hole, thereby preventing formation of, and increase of parasitic capacitance by, any additional raised structure in source/drain regions that are not contacted.

According to an aspect of the present disclosure, a semiconductor structure including a field effect transistor (FET) is provided. The semiconductor structure includes: an underlying source/drain region; a lower raised source/drain region located on the underlying source/drain region; at least one contact-level dielectric layer overlying the lower raised source/drain region; and a stack including an upper raised source/drain region in contact with the lower raised source/drain region and a contact via structure embedded within the at least one contact-level dielectric layer, wherein the upper raised source/drain region has a same horizontal cross-sectional area as a bottom portion of the contact via structure.

According to another aspect of the present disclosure, a method of manufacturing a semiconductor structure is provided, which includes: forming a field effect transistor (FET) including at least an underlying source/drain region and a lower raised source/drain region on at least one semiconductor portion; forming at least one contact-level dielectric layer over the field effect transistor; forming a contact via hole extending to a surface of the lower raised source/drain region in the at least one contact-level dielectric layer; and forming an upper raised source/drain region at a bottom portion of the contact via hole.

DETAILED DESCRIPTION

Figure 1:
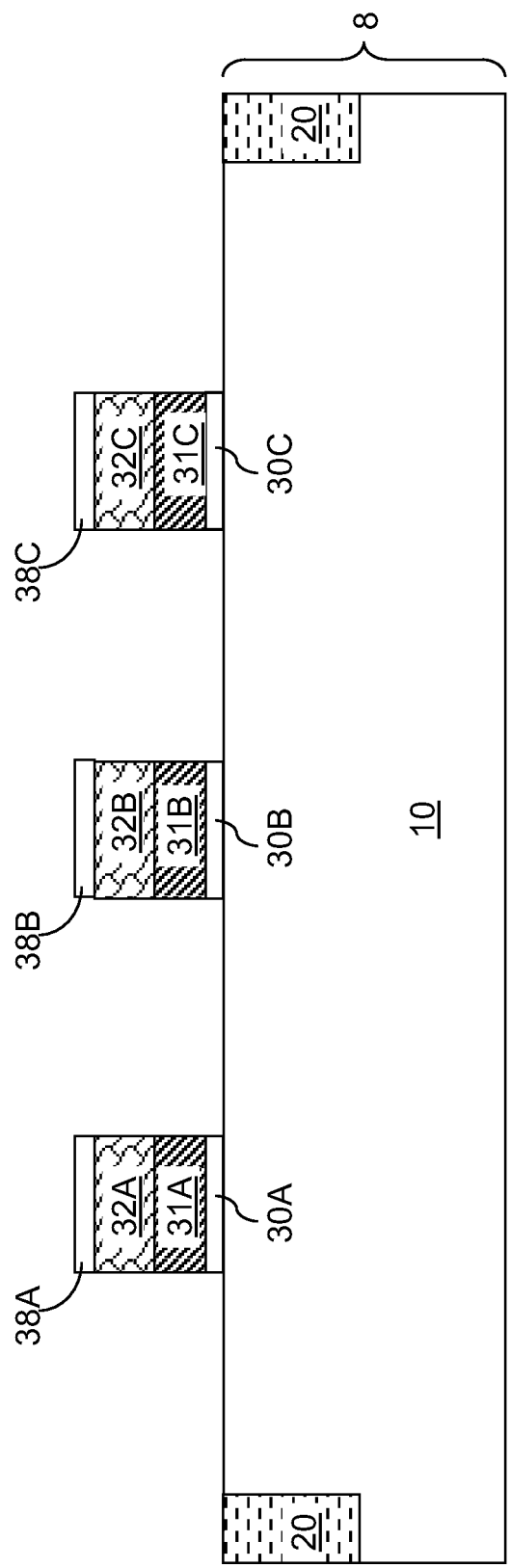
FIG. 1 is a vertical cross-sectional view of a first exemplary semiconductor structure after formation of gate stack structures according to a first embodiment of the present disclosure.

As stated above, the present disclosure relates to semiconductor devices including at least one selectively raised source/drain region that is laterally confined to an area of a contact via structure, and methods of manufacturing the same, which are now described in detail with accompanying figures. It is noted that like reference numerals refer to like elements across different embodiments. The drawings are not necessarily drawn to scale. The drawings are not necessarily drawn to scale.

As used herein, ordinals such as "first," "second," "third," and "fourth" are employed to distinguish similar elements, and a same element may be labeled with different ordinals across the specification and the claims.

As used herein, a "field effect transistor" refers to any transistor that employs field effect to control the operation of the device, and includes metal-semiconductor-insulator (MOS) field effect transistors, junction field effect transistors, and all types of planar and fin-configuration variants thereof as known in the art. A "planar" field effect transistor herein refers to a field effect transistor having a channel that consists of a semiconductor region located underneath a single planar semiconductor surface located within a single geometrical plane.

Referring to FIG. 1, a first exemplary semiconductor structure according to a first embodiment of the present disclosure includes a substrate 8 and gate stacks formed thereupon. The substrate 8 can be a semiconductor-on-insulator (SOI) substrate or a bulk semiconductor substrate. The substrate 8 includes a semiconductor material layer 10, which can include a single crystalline semiconductor material such as single crystalline silicon.

The semiconductor material layer 10 can be a top semiconductor layer of a semiconductor-on-insulator (SOI) substrate or a semiconductor material portion of a bulk semiconductor substrate. Various doped wells (not shown) having p-type or n-type doping can be formed in the semiconductor material layer 10. Shallow trench isolation structures 20 including a dielectric material can be formed in the substrate 8 to provide electrical isolation between neighboring semiconductor devices to be formed. The semiconductor material of the semiconductor material layer 10 is herein referred to as a first semiconductor material, which can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the semiconductor material layer 10 is single crystalline.

Gate stack layers are deposited on the top surface of the substrate 8. The gate stack layers can include a stack, from bottom to top, of a gate dielectric layer, a gate conductor layer, and optionally, a gate cap dielectric layer. The gate stack layers can be "blanket" layers, i.e., unpatterned planar layers, each having a uniform thickness throughout. Gate stacks are formed by patterning the gate stack layers. For example, the gate stack layers can be patterned by an anisotropic etch process employing a patterned photoresist (not shown) as a masking layer to form gate stacks, each including a gate dielectric, a gate conductor, and optionally, a gate cap dielectric.

For example, a first gate stack, a second gate stack, and a third gate stack can be provided. The first gate stack can include a first gate dielectric 30A, a first lower gate conductor portion 31A, a first upper gate conductor portion 32A, and a first gate cap dielectric 38A. The second gate stack can include a second gate dielectric 30B, a second lower gate conductor portion 31B, a second upper gate conductor portion 32B, and a second gate cap dielectric 38B. The third gate stack can include a third gate dielectric 30C, a third lower gate conductor portion 31C, a third upper gate conductor portion 32C, and a third gate cap dielectric 38C.

The gate dielectric layer, and consequently, each of the first, second, and third gate dielectric (30A, 30B, 30C), can include a dielectric material, which can be silicon oxide, silicon nitride, silicon oxynitride, or a stack thereof. Alternately or additionally, the gate dielectric layer, and consequently, each of the first, second, and third gate dielectric (30A, 30B, 30C), can include a high dielectric constant (high-k) material layer having a dielectric constant greater than 3.9. In one embodiment, the gate dielectric layer can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, although lesser and greater thicknesses can also be employed.

The gate conductor layer can be a single layer or a plurality of layers. In one embodiment, the gate conductor layer can include a lower gate conductor layer from which the first, second, and third lower gate conductor portions are patterned (31A, 31B, 31C) and an upper gate conductor layer from which the first, second, and third upper gate conductor portions are patterned (32A, 32B, 32C). The gate conductor layer, and consequently, each of the first, second, and third lower gate conductor portion (31A, 31B, 31C) and each of the first, second, and third upper gate conductor portion (32A, 32B, 32C), can include a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten. The thickness of the gate conductor layer can be from 20 nm to 200 nm, although lesser and greater thicknesses can also be employed.

If a gate cap dielectric layer is formed, the gate cap dielectric layer, and consequently, the first, second, and third gate cap dielectric portions (38A, 38B, 38C) derived therefrom, can include a dielectric material such as silicon nitride, silicon oxide, organosilicate glass (OSG), a high dielectric constant (high-k) material layer that can be employed for the gate dielectric layer, or a combination thereof. The gate cap dielectric layer can be deposited, for example, by chemical vapor deposition or by any other deposition method known in the art. The thickness of the gate cap dielectric layer, if present, can be from 10 nm to 200 nm, and typically from 20 nm to 100 nm, although lesser and greater thicknesses can also be employed.

Figure 2:
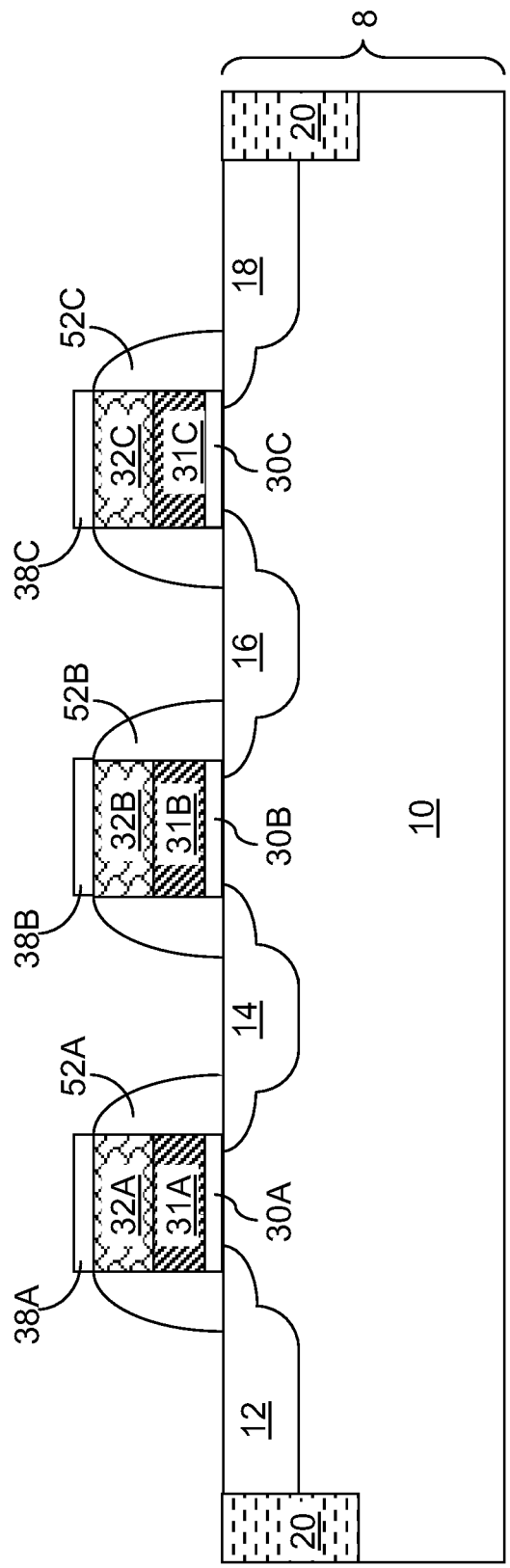
FIG. 2 is a vertical cross-sectional view of the first exemplary semiconductor structure after formation of underlying source/drain regions and gate spacers according to the first embodiment of the present disclosure.

Referring to FIG. 2, various underlying source/drain regions and gate spacers are formed. The various underlying source/drain regions can include, for example, a first underlying source/drain region 12, a second underlying source/drain region 14, a third underlying source/drain region 16, and a fourth underlying source/drain region 18. The various underlying source/drain regions (12, 14, 16, 18) are planar source/drain regions. The various underlying source/drain regions (12, 14, 16, 18) can be formed, for example, by ion implantation employing patterned implantation masks. The ion implantations can be performed before, and/or after, formation of the gate spacers.

Each of the various underlying source/drain regions (12, 14, 16, 18) can function as a part of a source or as a part of a drain so that each of the first gate stack (30A, 31A, 32A, 38A), the second gate stack (30B, 31B, 32B, 38B), and the third gate stack (30C, 31C, 32C, 38C) functions as a stack of a gate dielectric and a gate electrode for a field effect transistor (FET). Each FET in this case is a planar FET. In one embodiment, the top surface of each underlying source/drain region (12, 14, 16, 18) is substantially coplanar with the interface between each contacting pair of a gate dielectric, i.e., one of the first, second, and third gate dielectrics (30A, 30B, 30C) and a body region of the FET. Alternately, the surface of each underlying source/drain region (12, 14, 16, 18) can be recessed below the interface between each contacting pair of a gate dielectric by a few nanometers. In one embodiment, the underlying source/drain regions (12, 14, 16, 18) can be formed by diffusion from lower raised source/drain regions to be subsequently formed thereupon by in-situ doped selective deposition or a combination of selective deposition of an undoped semiconductor material and doping by ion implantation.

The gate spacers can include a first gate spacer 52A formed around the first gate stack (30A, 31A, 32A, 38A), a second gate spacer 52B formed around the second gate stack (30B, 31B, 32B, 38B), and a third gate spacer 52C formed around the third gate stack (30C, 31C, 32C, 38C). The gate spacers (52A, 52B, 52C) can be formed, for example, by conformal deposition of a dielectric material layer and an anisotropic etch that removes horizontal portions of the dielectric material layer. The remaining vertical portions of the dielectric material layer constitute the gate spacers (52A, 52B, 52C).

Figure 3:
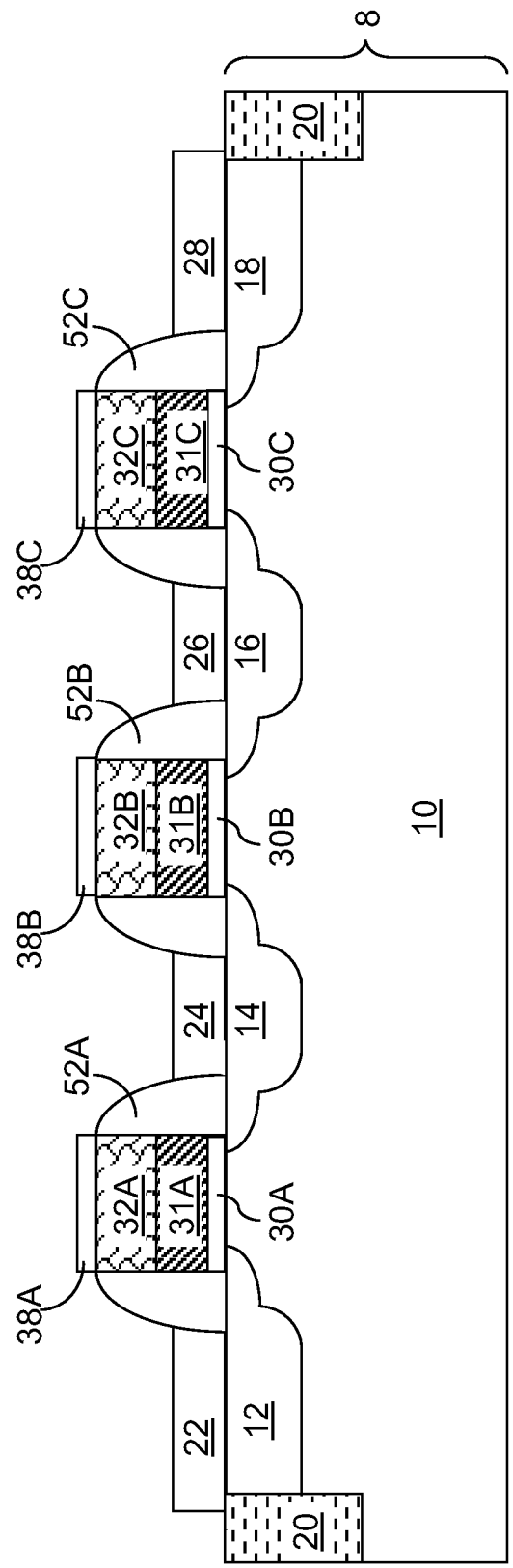
FIG. 3 is a vertical cross-sectional view of the first exemplary semiconductor structure after formation of lower raised source/drain regions according to the first embodiment of the present disclosure.

Referring to FIG. 3, various raised source/drain regions are formed by selectively depositing a semiconductor material. The various raised source/drain regions are herein referred to as lower raised source/drain regions in order to distinguish from additional raised source/drain regions to be subsequently formed. The selectively deposited semiconductor material is herein referred to as a second semiconductor material. The second semiconductor material is deposited selectively only on semiconductor surfaces, and is not deposited on dielectric surfaces. The selectively deposited second semiconductor material forms various lower raised source/drain regions, which include a first lower raised source/drain region 22 formed directly on the first underlying source/drain region 12, a second lower raised source/drain region 24 formed directly on the second underlying source/drain region 14, a third lower raised source/drain region 26 formed directly on the third underlying source/drain region 16, and a fourth lower raised source/drain region 28 formed directly on the fourth underlying source/drain region 18.

The second semiconductor material can be the same as, or different from, the first semiconductor material. The second semiconductor material can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the various raised source/drain regions (22, 24, 26, 28) is single crystalline.

During the selective deposition, the second semiconductor material is deposited only on exposed semiconductor surfaces while the second semiconductor material is not deposited on dielectric surfaces. The selective deposition can employ simultaneous or alternating steps of deposition and etch of the second semiconductor material. The deposition is effected by flowing a reactant gas including a precursor for the second semiconductor material in a processing chamber in which the first exemplary semiconductor structure is placed for processing. Exemplary precursors to the second semiconductor material include, but are not limited to, $SiH_4$, $Si_2H_6$, $SiH_2Cl_2$, $SiHCl_3$, $SiCl_4$, $GeH_4$, $Ge_2H_6$, $GeH_2Cl_2$, and other precursor materials for compound semiconductor materials as known in the art. The etch step, which can be performed simultaneously with or in alternation with the deposition step, is effected by flowing an etchant gas in the processing chamber. Exemplary etchants include, but are not limited to, HCl. The thickness of the various lower raised source/drain region (22, 24, 26, 28) can be, for example, from 2 nm to 100 nm, although lesser and greater thicknesses can also be employed.

The various underlying source/drain regions (12, 14, 16, 18) can have a doping of the same conductivity type, i.e., p-type or n-type, or can be doped with dopants of different conductivity types. Each of the various lower raised source/drain region (22, 24, 26, 28) can be formed with in-situ doping that is of the same conductivity type as the underlying source/drain region (12, 14, 16, 18) on which that lower raised source/drain region (22, 24, 26, or 28) is formed. If the various underlying source/drain regions (12, 14, 16, 18) are doped with dopants of different conductivity types, two separate selective epitaxy processes can be employed to provide different types of in-situ doping for the various lower raised source/drain region (22, 24, 26, 28). Alternately, the various lower raised source/drain regions (22, 24, 26, 28) can be formed as intrinsic semiconductor material portions, and can be subsequently doped with p-type dopants or n-type dopants by masked ion implantation.

In one embodiment, the various underlying source/drain regions (12, 14, 16, 18) are single crystalline, and the selective deposition process can be a selective epitaxy process. In this case, each of the various lower raised source/drain regions (22, 24, 26, 28) is epitaxially aligned to one of the various underlying source/drain regions (12, 14, 16, 18). As used herein, a first element is epitaxially aligned to a second element if a single crystalline structure extends throughout the first element and the second element.

Each portion of the semiconductor material layer 10 that is in contact with a gate dielectric (30A, 30B, 30C) and located between a neighboring pair of underlying source/drain regions (12, 14, 16, 18) constitutes a body region for a field effect transistor that includes that gate dielectric (30A, 30B, 30C). Each body region is in contact with the neighboring pair of underlying source/drain regions (12, 14, 16, 18). In one embodiment, the interface between a lower raised source/drain region (22, 24, 26, or 28) and the underlying source/drain region (12, 14, 16, or 18) located directly underneath is coplanar with top surface of the body region, which is the interface between the body region and the one of the gate dielectrics (30A, 30B, 30C). Various field effect transistors are formed on the substrate 10.

The various field effect transistors can include a common source/drain region that functions as a source or a drain for one field effect transistor and concurrently functions as a source or a drain for another field effect transistor. For example, the combination of the first underlying source/drain region 12 and the first lower raised source/drain region 22 functions as one of the source or the drain of a first field effect transistor including the first gate stack (30A, 31A, 32A, 38A), and the combination of the second underlying source/drain region 14 and the second lower raised source/drain region 24 functions as the other of the source and the drain of the first field effect transistor including the first gate stack (30A, 31A, 32A, 38A). The combination of the second underlying source/drain region 14 and the second lower raised source/drain region 24 functions as one of the source or the drain of a second field effect transistor including the second gate stack (30A, 31A, 32A, 38A), and the combination of the third underlying source/drain region 16 and the third lower raised source/drain region 26 functions as the other of the source and the drain of the second field effect transistor including the second gate stack (30A, 31A, 32A, 38A). The combination of the third underlying source/drain region 16 and the third lower raised source/drain region 26 functions as one of the source or the drain of a third field effect transistor including the third gate stack (30A, 31A, 32A, 38A), and the combination of the fourth underlying source/drain region 18 and the fourth lower raised source/drain region 28 functions as the other of the source and the drain of the third field effect transistor including the third gate stack (30A, 31A, 32A, 38A).

Figure 4:
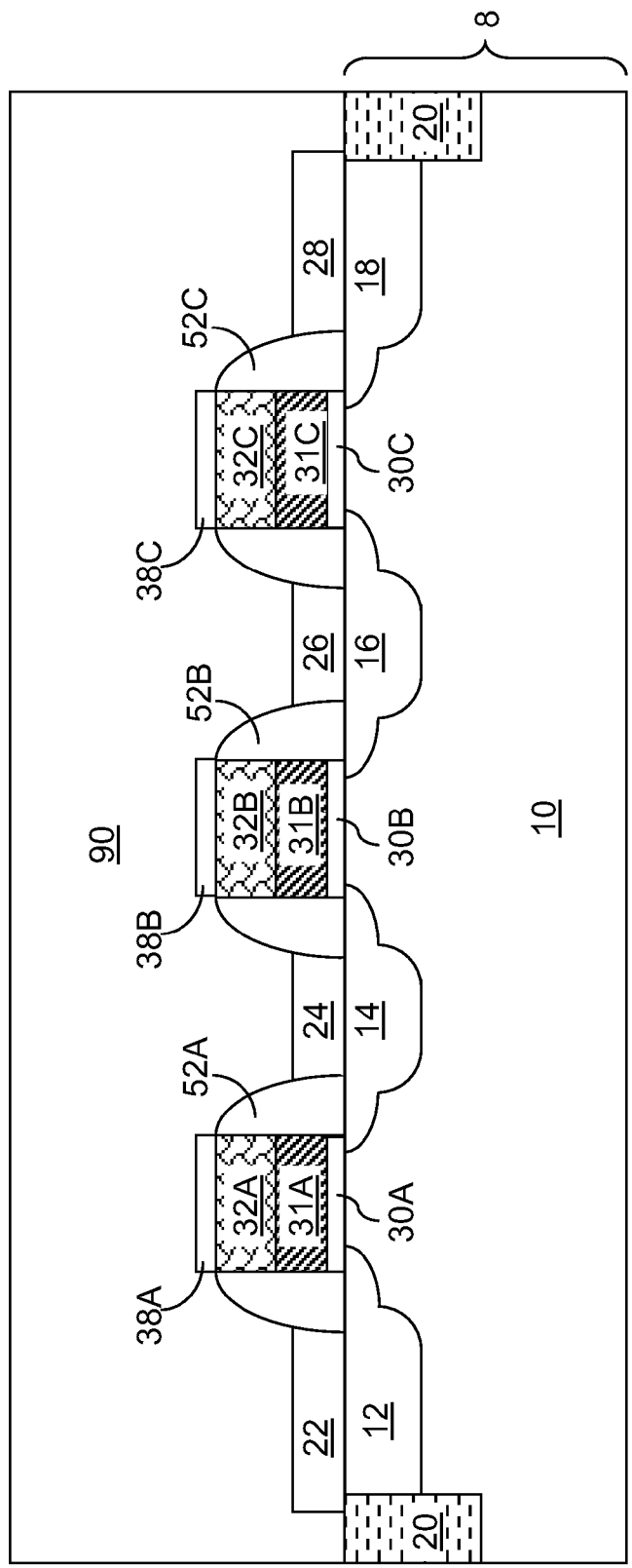
FIG. 4 is a vertical cross-sectional view of the first exemplary semiconductor structure after formation of at least one contact-level dielectric layer according to the first embodiment of the present disclosure.

Referring to FIG. 4, at least one contact-level dielectric layer 90 is formed over the various gate stacks and the various lower raised source/drain regions (22, 24, 26, 28). The at least one contact-level dielectric layer 90 can include a dielectric material such as undoped silicon oxide, doped silicon oxide, silicon nitride, porous or non-porous organosilicate glass, porous or non-porous nitrogen-doped organosilicate glass, or a combination thereof. The at least one contact-level dielectric layer 90 can be deposited, for example, by chemical vapor deposition or spin-coating. If the top layer of the at least one contact-level dielectric layer 90 is not self-planarizing, the top surface of the at least one contact-level dielectric layer 90 can be planarized, for example, by chemical mechanical planarization.

Figure 5:
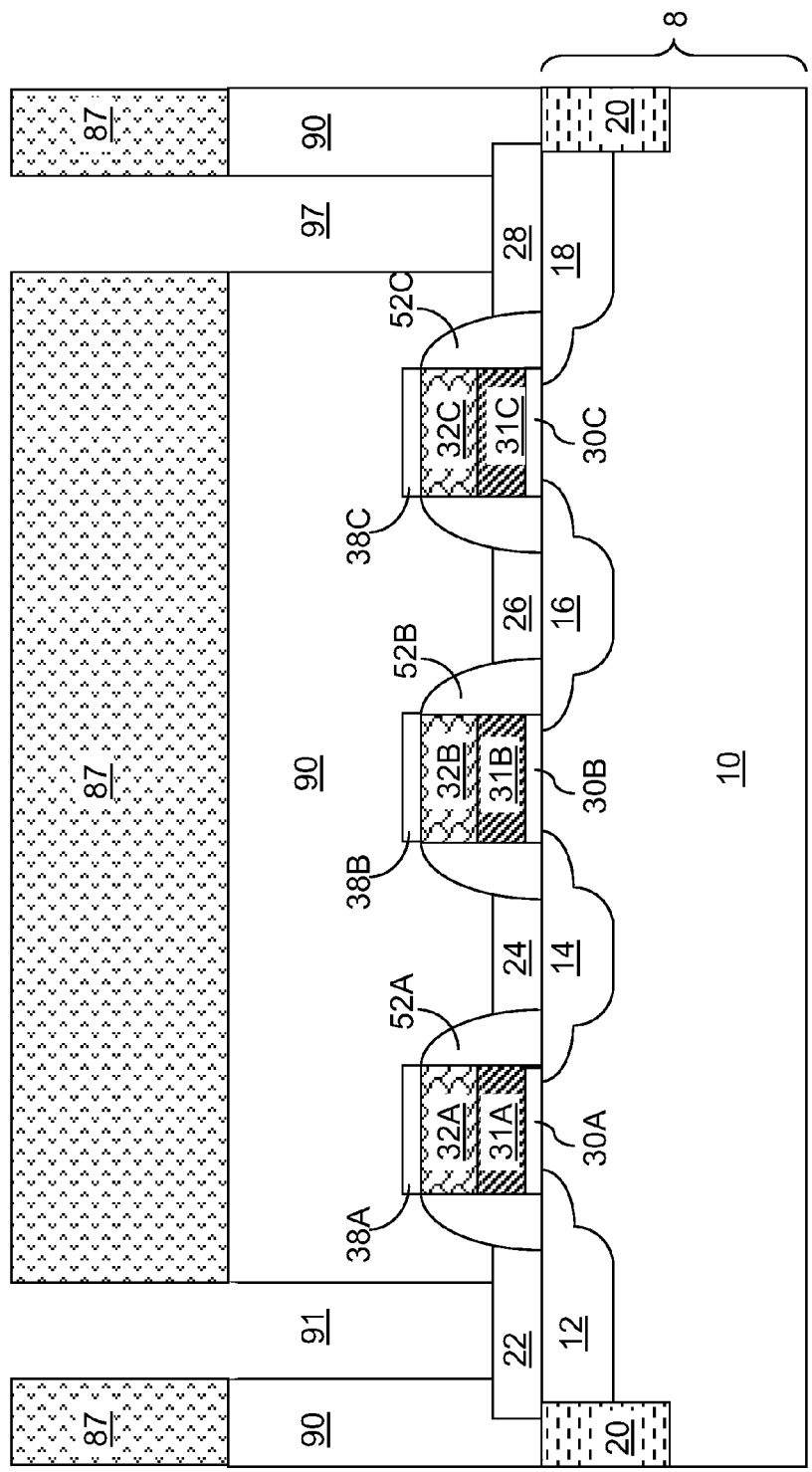
FIG. 5 is a vertical cross-sectional view of the first exemplary semiconductor structure after formation of contact via holes according to the first embodiment of the present disclosure.

Referring to FIG. 5, a photoresist layer 87 is applied over the at least one contact-level dielectric layer 90, and is lithographically patterned to form various openings therein. The various openings overlie a portion of the various gate stacks or one of the lower raised source/drain regions (22, 24, 26, 28).

The pattern in the photoresist layer 87 is transferred through the at least one contact-level dielectric layer 90 and through the optional gate cap dielectric portions (38A, 38B, 38C), if present, to form various contact via holes within the at least one contact-level dielectric layer 90. The various contact via holes can include, for example, a first source/drain contact via hole 91, and a second source/drain contact via hole 97. The first and second source/drain contact via holes (91, 97) extend from the planar top surface of the at least one dielectric layer a surface of a lower raised source/drain region (22, 28) through the at least one contact-level dielectric layer 90. An anisotropic etch having a chemistry that removes the dielectric materials of the at least one contact-level dielectric layer 90 and the optional gate cap dielectric portions (38A, 38B, 38C) selective to the second semiconductor material and the semiconductor material of the top portions of the gate electrodes (31A, 32A, 31B, 32B) can be employed. The photoresist layer 87 is subsequently removed, for example, by ashing.

Figure 6:
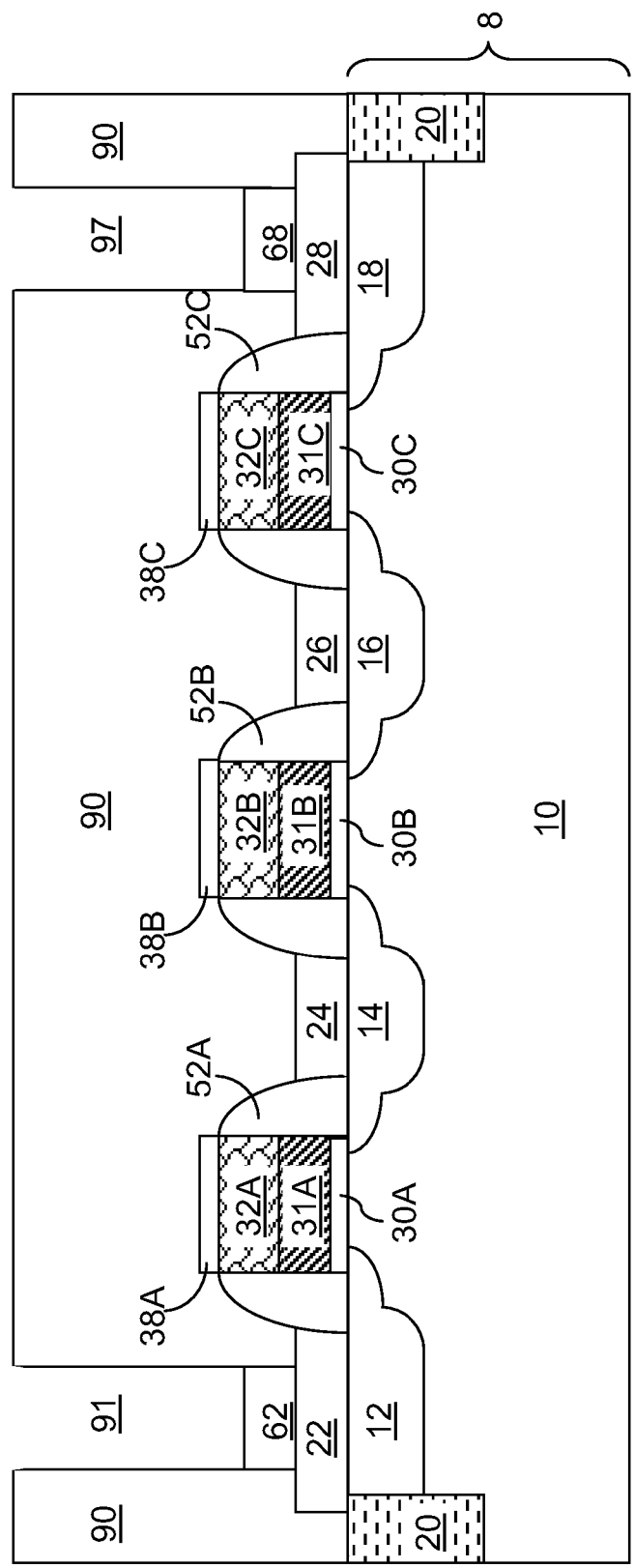
FIG. 6 is a vertical cross-sectional view of the first exemplary semiconductor structure after formation of upper raised source/drain regions according to the first embodiment of the present disclosure.
Figure 7:
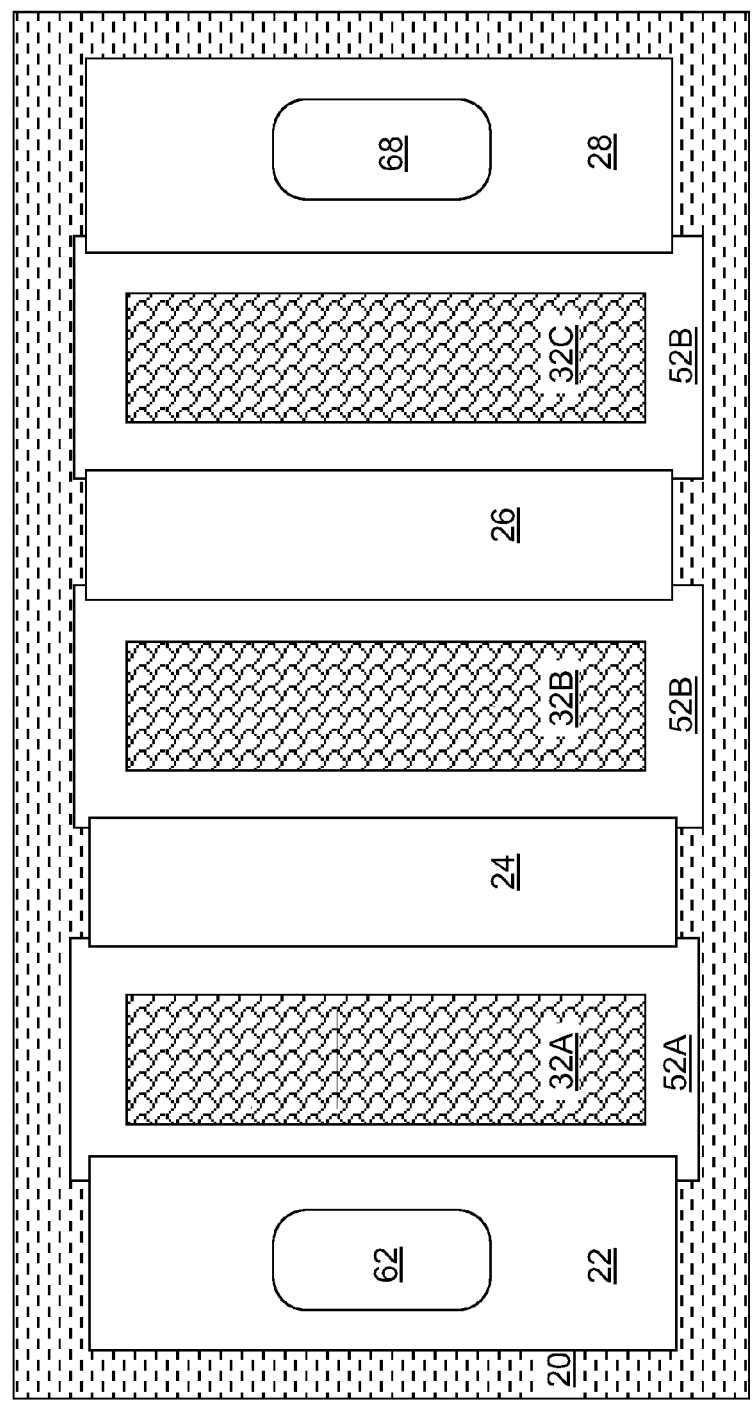
FIG. 7 is a top-down view of the first exemplary semiconductor structure of FIG. 6.

Referring to FIGS. 6 and 7, additional raised source/drain regions are formed at a bottom portion of the first and second source/drain contact via holes (91, 97) and directly on a physically exposed portions of the first and fourth lower raised source/drain regions (22, 28). The various additional raised source/drain regions are herein referred to as upper raised source/drain regions in order to distinguish from lower raised source/drain regions (22, 24, 26, 28) that are previously formed.

The first and second upper raised source/drain regions (62, 68) are formed by selectively depositing a semiconductor material. The selectively deposited semiconductor material is herein referred to as a third semiconductor material. The third semiconductor material is deposited selectively only on semiconductor surfaces, and is not deposited on dielectric surfaces. The selectively deposited third semiconductor material forms various upper raised source/drain regions, which include a first upper raised source/drain region 62 that is formed directly on the first lower raised source/drain region 22 and a second upper raised source/drain region 68 that is formed directly on the fourth lower raised source/drain region 28.

The third semiconductor material can be the same as, or different from, the first semiconductor material and/or the second semiconductor material. The third semiconductor material can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the first and second upper raised source/drain regions (62, 68) is single crystalline.

During the selective deposition, the third semiconductor material is deposited only on exposed semiconductor surfaces while the third semiconductor material is not deposited on dielectric surfaces. The selective deposition can employ simultaneous or alternating steps of deposition and etch of the third semiconductor material. The deposition is effected by flowing a reactant gas including a precursor for the third semiconductor material in a processing chamber in which the first exemplary semiconductor structure is placed for processing. Exemplary precursors to the third semiconductor material include, but are not limited to, $SiH_4$, $Si_2H_6$, $SiH_2Cl_2$, $SiHCl_3$, $SiCl_4$, $GeH_4$, $Ge_2H_6$, $GeH_2Cl_2$, and other precursor materials for compound semiconductor materials as known in the art. The etch step, which can be performed simultaneously with or in alternation with the deposition step, is effected by flowing an etchant gas in the processing chamber. Exemplary etchants include, but are not limited to, HCl. The thickness of the first and second upper raised source/drain regions (62, 68) can be, for example, from 2 nm to 100 nm, although lesser and greater thicknesses can also be employed.

Each of the first and second upper raised source/drain regions (62, 68) can be formed with in-situ doping that is of the same conductivity type as the lower raised source/drain region (22 or 28) on which that first and second upper raised source/drain regions (62 or 68) is formed. If the first and fourth lower raised source/drain region (22, 28) are doped with dopants of different conductivity types, two separate selective epitaxy processes can be employed to provide different types of in-situ doping for the first and second upper raised source/drain regions (62, 68). Alternately, the first and second upper raised source/drain region (62, 68) can be formed as intrinsic semiconductor material portions, and can be subsequently doped with p-type dopants or n-type dopants by masked ion implantation.

In one embodiment, the various underlying source/drain regions (12, 14, 16, 18) and the first and fourth lower raised source/drain region (22, 28) are single crystalline, and the selective deposition process can be a selective epitaxy process. In this case, each of the first and second upper raised source/drain regions (62, 68) is epitaxially aligned to one of the various underlying source/drain regions (12, 18) through a lower raised source/drain region (22, 28).

Each of the first and second upper raised source/drain regions (62, 68) becomes an added component of a preexisting underlying source or a preexisting underlying drain. Thus, the source or drain that includes the combination of the first underlying source/drain region 12 and the first lower raised source/drain region 22 is modified to further include the first upper raised source/drain region 62, and the source or drain that includes the combination of the fourth underlying source/drain region 18 and the fourth lower raised source/drain region 28 is modified to include the second upper raised source/drain region 68.

Because the surfaces of the second and third lower raised source/drain regions (24, 26) are not physically exposed, no material is deposited on the second and third lower raised source/drain regions (24, 26).

In one embodiment, each of the first and second upper raised source/drain regions (62, 68) is epitaxially aligned to a lower raised source/drain region, i.e., one of the first and fourth lower raised source/drain regions (22, 28) and to an underlying source/drain region, i.e., one of the first and fourth underlying source/drain regions (12, 18). Each upper raised source/drain region (62, 68) is formed directly on a lower raised source/drain region (22, 28). Each upper raised source/drain region (62, 68) is formed by selective deposition of the third semiconductor material. The third semiconductor material does not grow on dielectric surfaces during the selective deposition.

In one embodiment, a field effect transistor, such as the first field effect transistor including the first gate stack (30A, 31A, 32A, 38A) and the third field effect transistor including the third gate stack (30C, 31A, 32C, 38C) can include a source and a drain such that one of the source and the drain, which is herein referred to as a first source/drain, includes a combination of an underlying source/drain region (12 or 18), a lower raised source/drain region (22 or 28), and an upper raised source/drain region (62 or 68), and the other of the source and the drain, which is herein referred to as a second source/drain, includes a combination of another source/drain region (14 or 16) and another lower raised source/drain region (24 or 26) and does not include any upper raised source/drain region. All surfaces of the lower raised source/drain region (24 or 26) of the second source/drain are in contact with an underlying source/drain region (14, 16) or the at least one contact-level dielectric layer 90 or the shallow trench isolation structure 20, i.e., the portion of the shallow trench isolation structure 20 that laterally confines the underlying source/drain region (14, 16).

Figure 8:
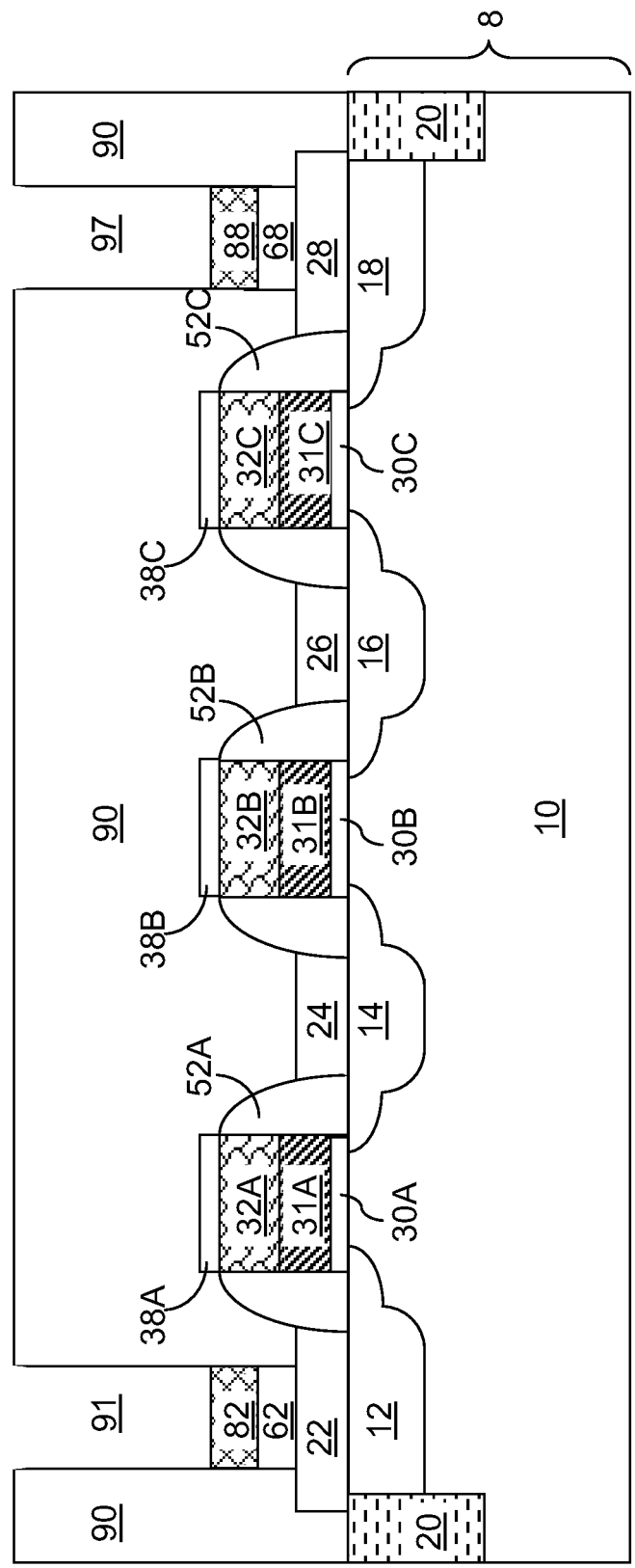
FIG. 8 is a vertical cross-sectional view of the first exemplary semiconductor structure after formation of metal semiconductor alloy regions according to the first embodiment of the present disclosure.

Referring to FIG. 8, a metal semiconductor alloy portions can be optionally formed on physically exposed semiconductor surfaces at the bottom of each contact via hole (91, 97). The metal semiconductor alloy portions can include, for example, a first source/drain metal semiconductor alloy portion 82, and a second source/drain metal semiconductor alloy portion 88.

The first and second metal semiconductor alloy portions (82, 88) include an alloy of a metal provided by a temporary metal layer and the semiconductor material of the first and second upper raised source/drain regions (62, 68).

The temporary metal layer can include a metal such as Ni, Pt, Co, Ti, Ta, and Co. The lateral thickness of the temporary metal layer on sidewalls of the various contact via holes (91, 97) is less than one half of the least lateral dimension within the various contact via holes (91, 97) to prevent plugging, and can be deposited, for example, by physical vapor deposition (PVD) or chemical vapor deposition. A reaction is induced during an anneal at an elevated temperature between the metal of the temporary metal layer and the underlying semiconductor materials to form the various metal semiconductor alloy portions (82, 88). The temperature of the anneal can be, for example, between 300 degrees Celsius and 1,000 degrees Celsius. The various metal semiconductor alloy portions (82, 88) can include a metal silicide, a metal germanide, a compound of a metal and at least two elemental semiconductor elements, or an alloy of a metal and a compound semiconductor material. Unreacted portions of the temporary metal layer is removed selective to the various metal semiconductor alloy portions (82, 88) and the at least one contact-level dielectric layer 90, for example, by a wet etch.

Each of the first and second source/drain metal semiconductor alloy portions (82, 88) is in contact with an upper raised source/drain region (62 or 68). The bottom surface of each of the first and second source/drain metal semiconductor alloy portions (82, 88) has the same area as the top surface of the upper raised source/drain region (62, 68) that is in contact with that source/drain metal semiconductor alloy portions (82 or 88).

Figure 9:
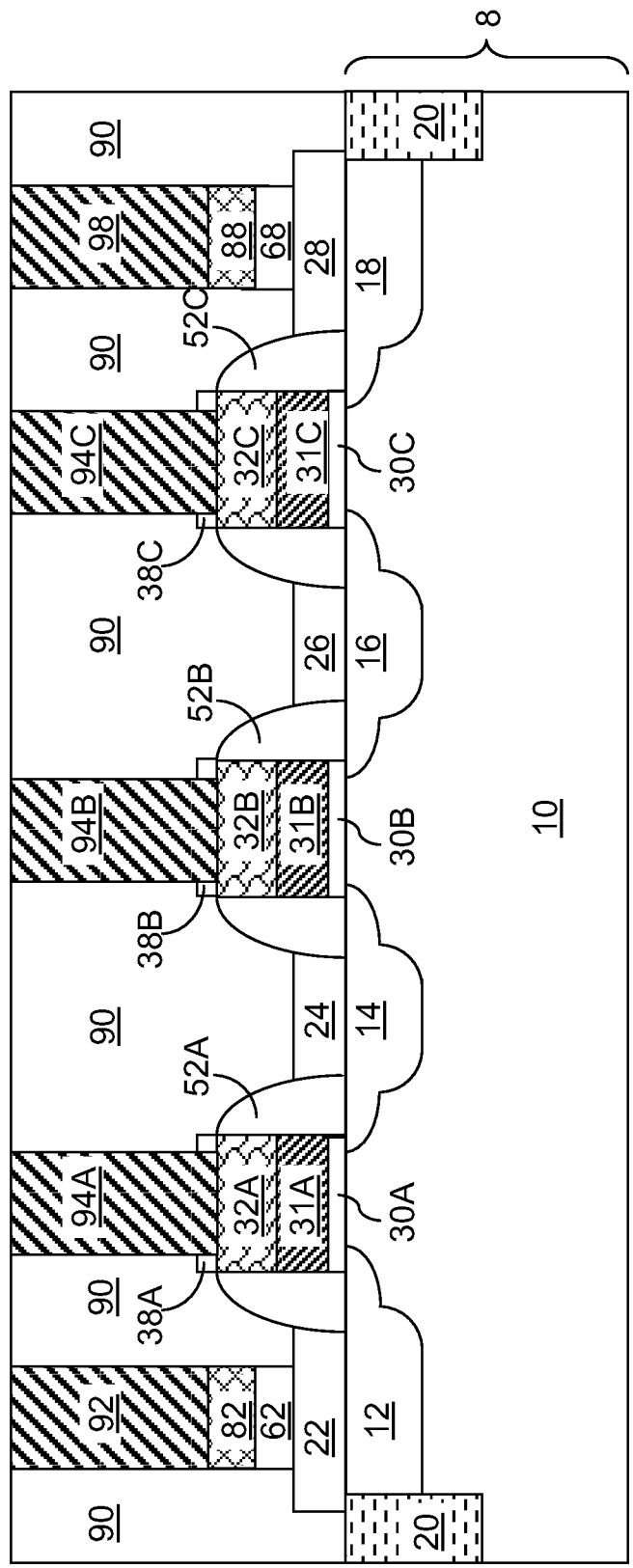
FIG. 9 is a vertical cross-sectional view of the first exemplary semiconductor structure after formation of contact via structures according to the first embodiment of the present disclosure.
Figure 10A:
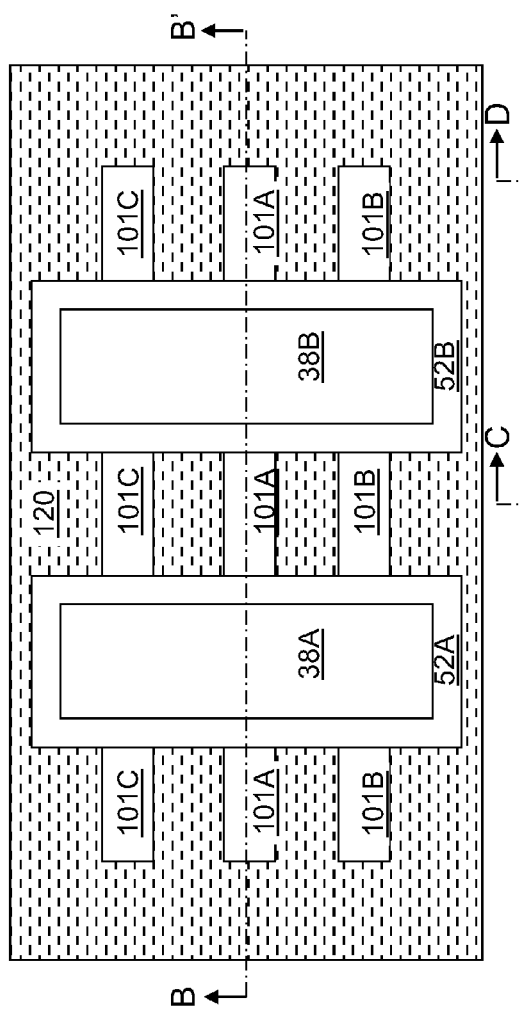
FIG. 10A is a top-down view of a second exemplary semiconductor structure after formation of semiconductor fins, gate stacks, and gate spacers according to a second embodiment of the present disclosure.
Figure 10B:
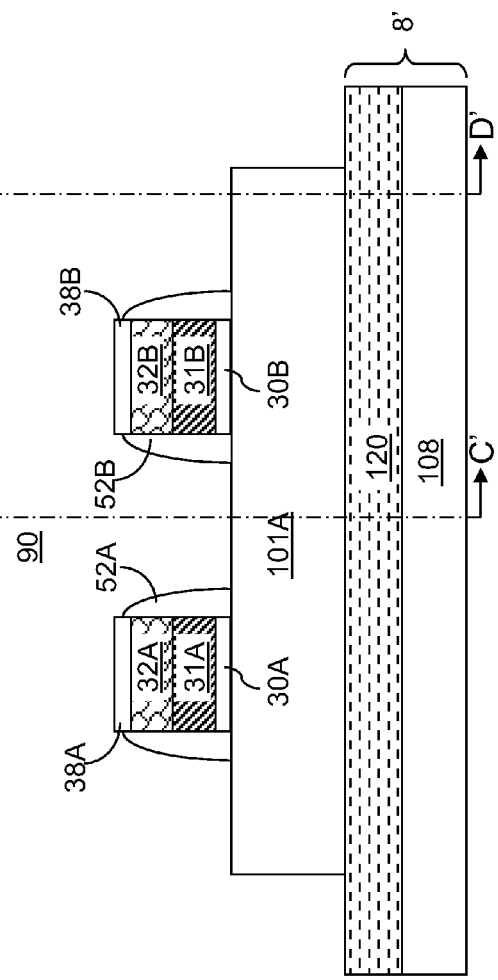
FIG. 10B is a vertical cross-sectional view of the second exemplary semiconductor structure of FIG. 10A along the plane B-B'.
Figure 10C:
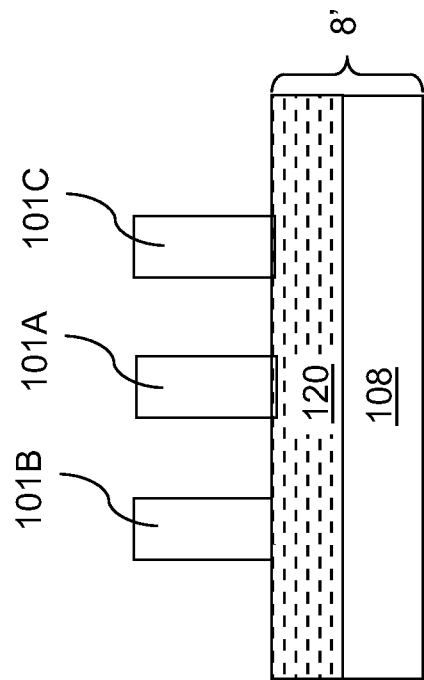
FIG. 10C is a vertical cross-sectional view of the second exemplary semiconductor structure of FIG. 10A along the plane C-C'.
Figure 10D:
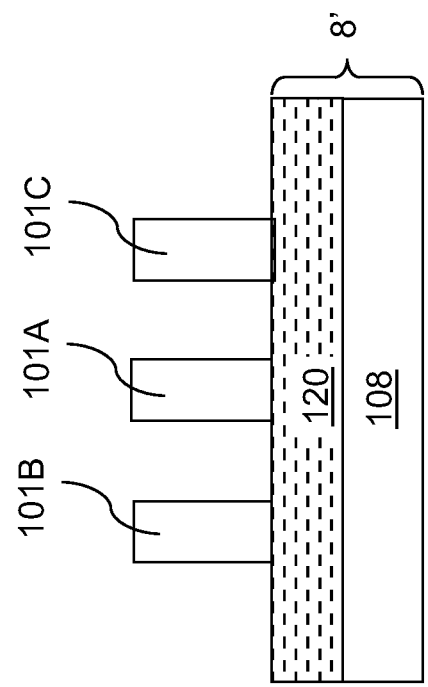
FIG. 10D is a vertical cross-sectional view of the second exemplary semiconductor structure of FIG. 10A along the plane D-D'.
Figure 11A:
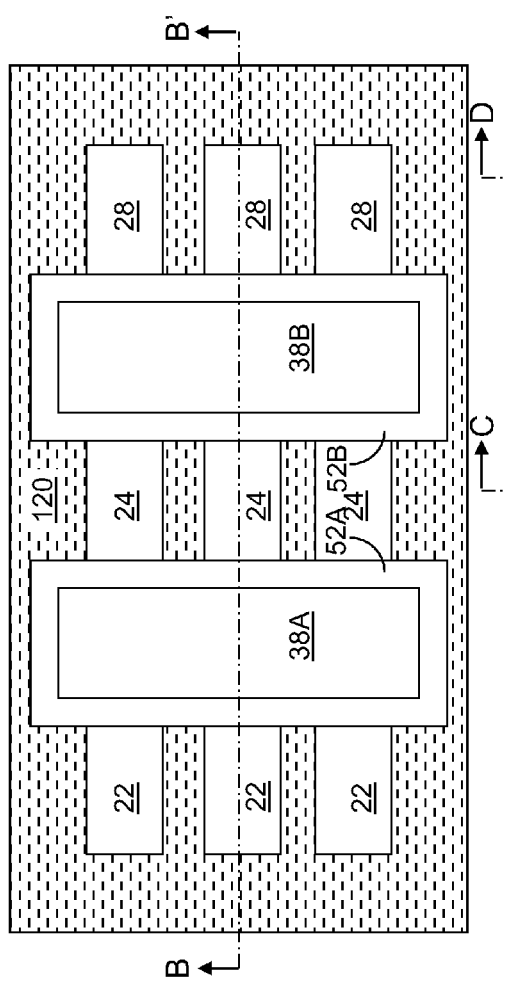
FIG. 11A is a top-down view of the second exemplary semiconductor structure after formation of lower raised source/drain regions by selective deposition according to the second embodiment of the present disclosure.
Figure 11B:
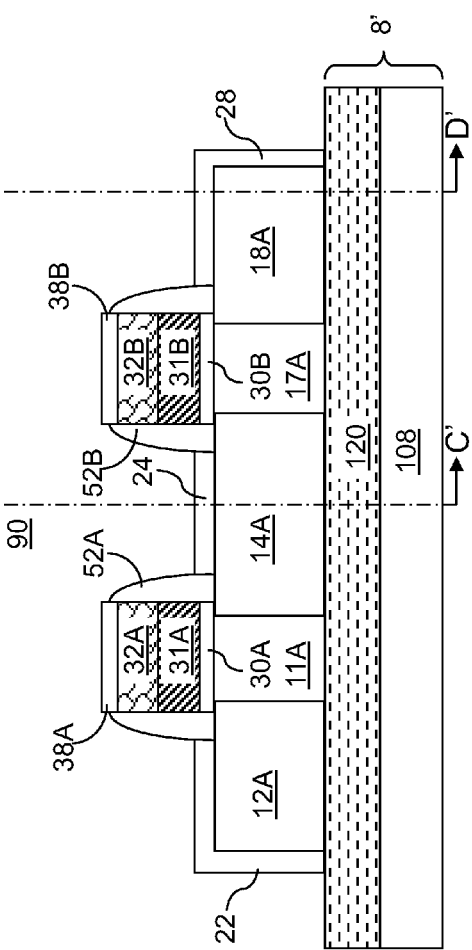
FIG. 11B is a vertical cross-sectional view of the second exemplary semiconductor structure of FIG. 11A along the plane B-B'.
Figure 11C:
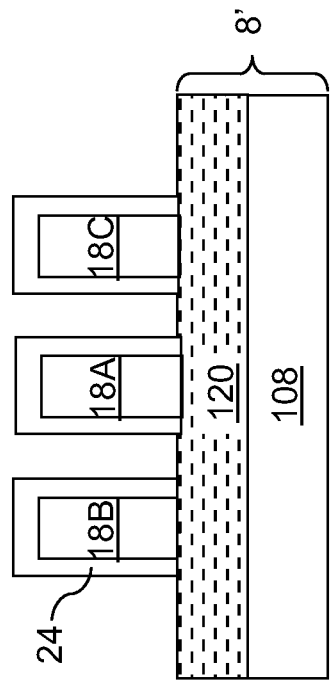
FIG. 11C is a vertical cross-sectional view of the second exemplary semiconductor structure of FIG. 11A along the plane C-C'.
Figure 11D:
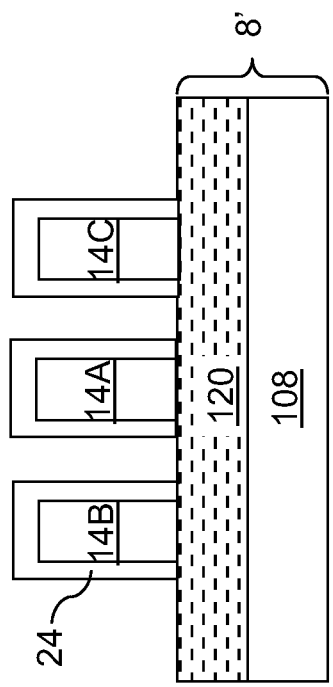
FIG. 11D is a vertical cross-sectional view of the second exemplary semiconductor structure of FIG. 11A along the plane D-D'.
Figure 12A:
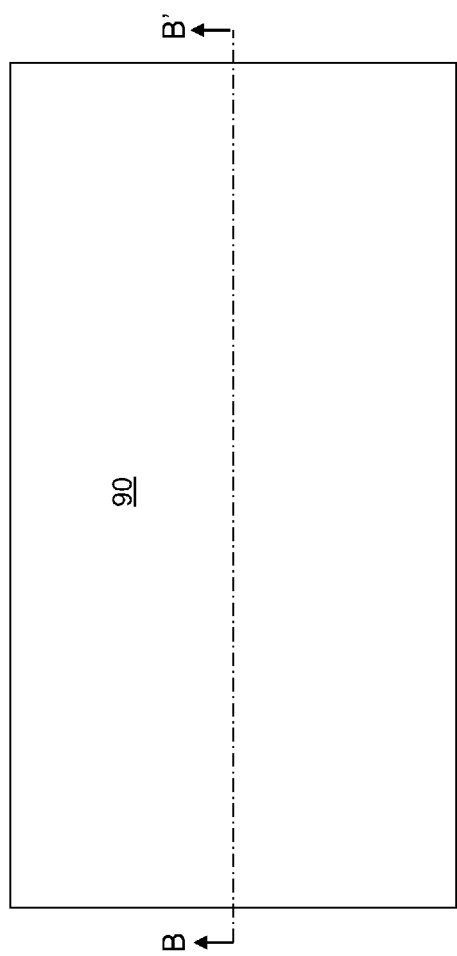
FIG. 12A is a top-down view of the second exemplary semiconductor structure after formation and planarization of at least one contact-level dielectric layer according to the second embodiment of the present disclosure.
Figure 12B:
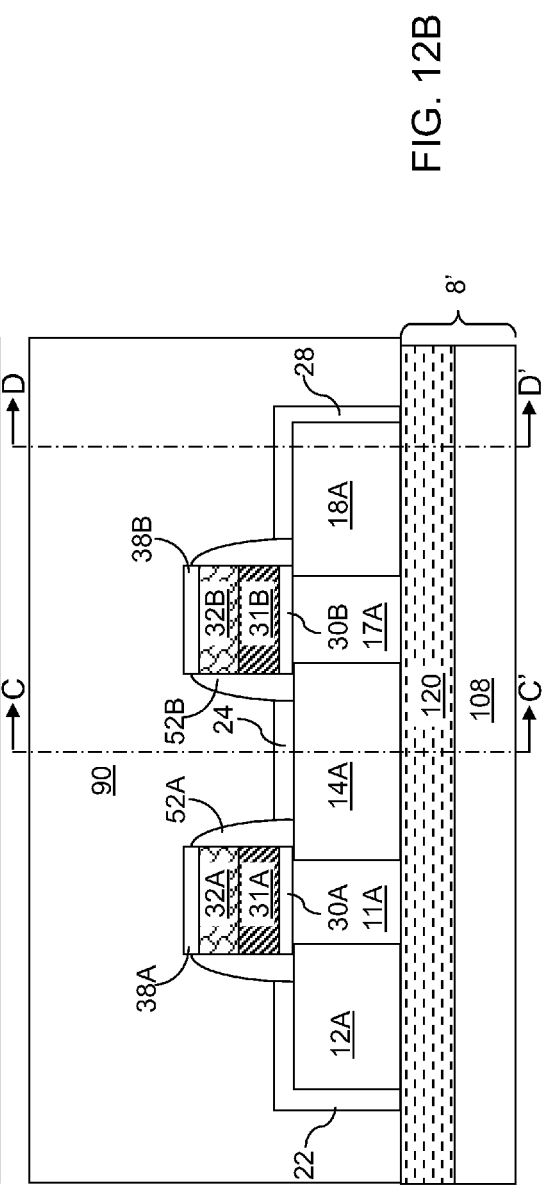
FIG. 12B is a vertical cross-sectional view of the second exemplary semiconductor structure of FIG. 12A along the plane B-B'.
Figure 12C:
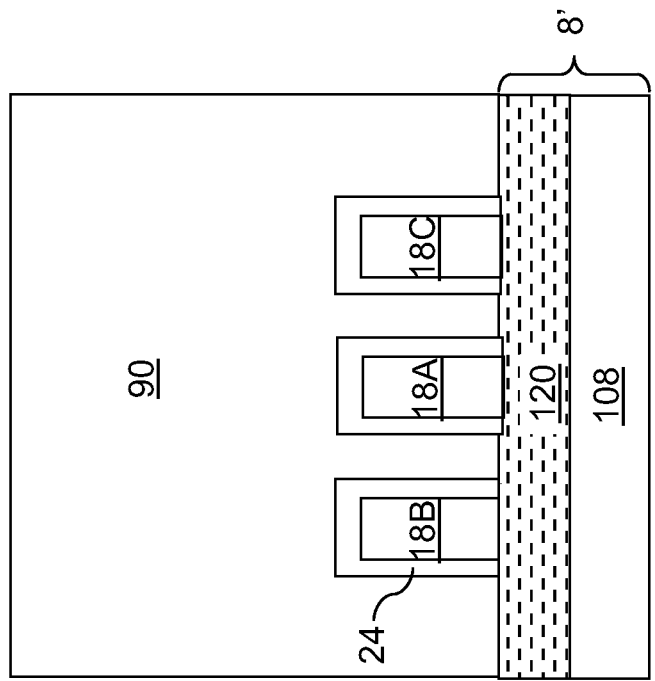
FIG. 12C is a vertical cross-sectional view of the second exemplary semiconductor structure of FIG. 12A along the plane C-C'.
Figure 12D:
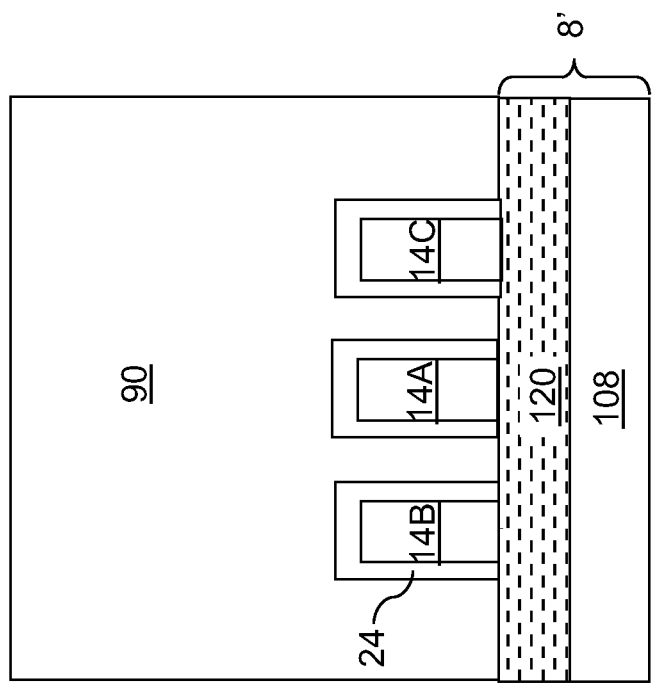
FIG. 12D is a vertical cross-sectional view of the second exemplary semiconductor structure of FIG. 12A along the plane D-D'.
Figure 13A:
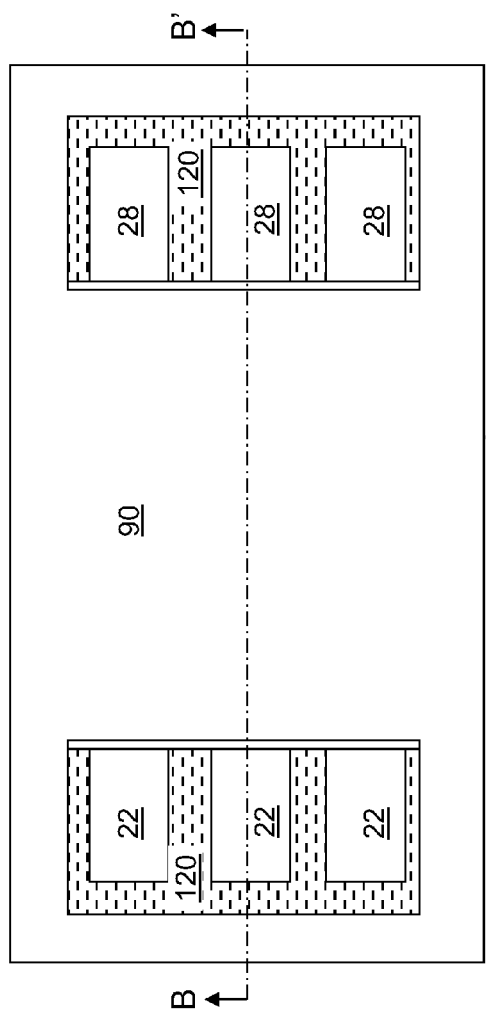
FIG. 13A is a top-down view of the second exemplary semiconductor structure after formation of contact via holes according to the second embodiment of the present disclosure.
Figure 13B:
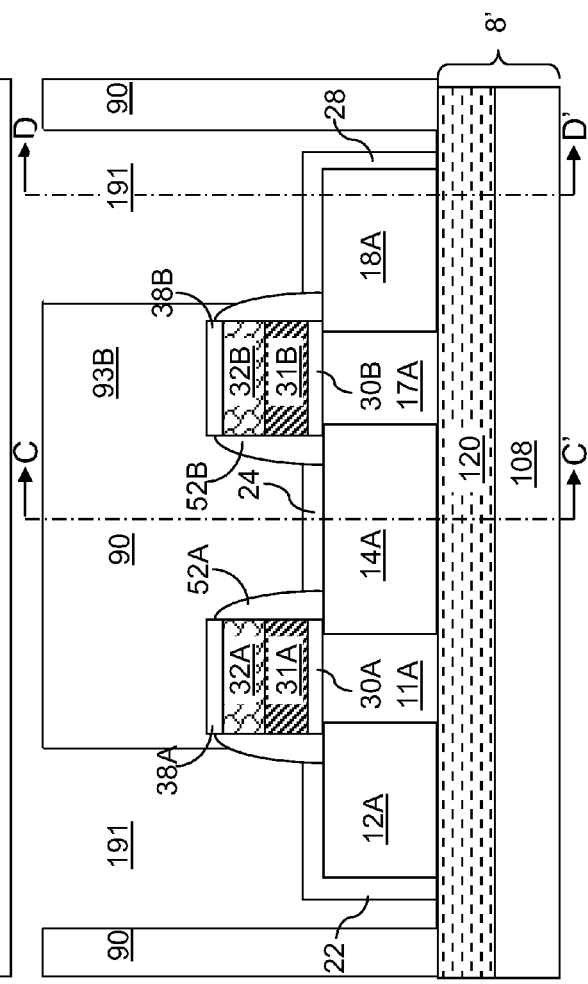
FIG. 13B is a vertical cross-sectional view of the second exemplary semiconductor structure of FIG. 13A along the plane B-B'.
Figure 13C:
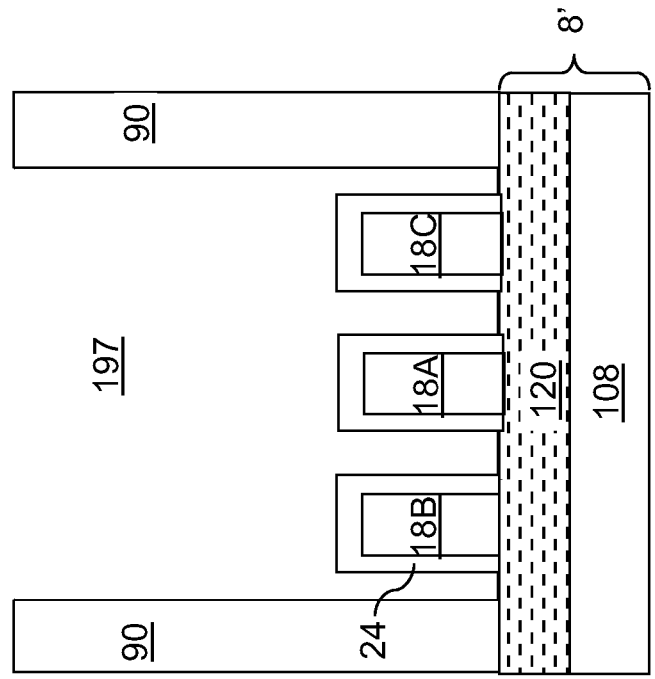
FIG. 13C is a vertical cross-sectional view of the second exemplary semiconductor structure of FIG. 13A along the plane C-C'.
Figure 13D:
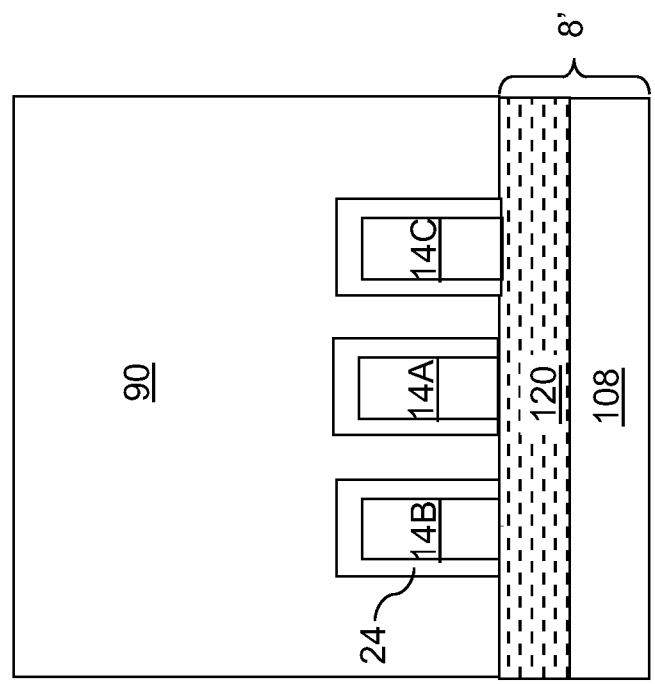
FIG. 13D is a vertical cross-sectional view of the second exemplary semiconductor structure of FIG. 13A along the plane D-D'.
Figure 14A:
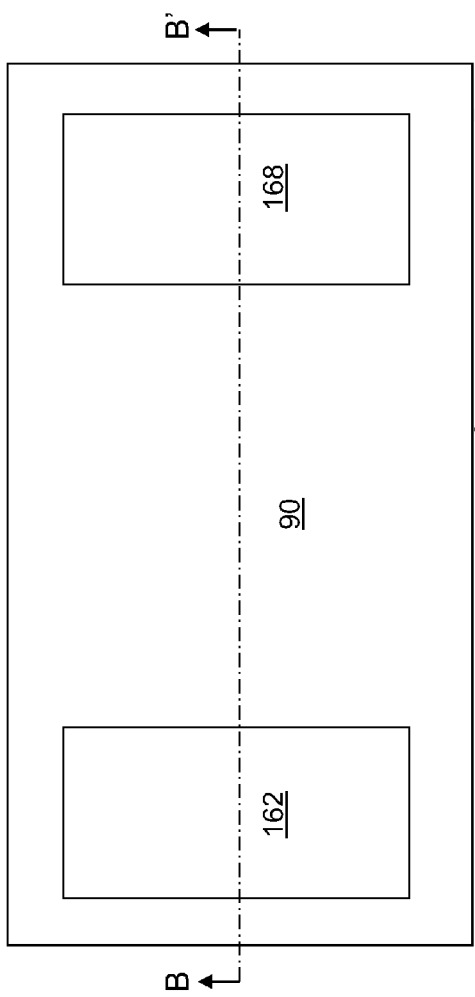
FIG. 14A is a top-down view of the second exemplary semiconductor structure after formation of upper raised source/drain regions according to the second embodiment of the present disclosure.
Figure 14B:
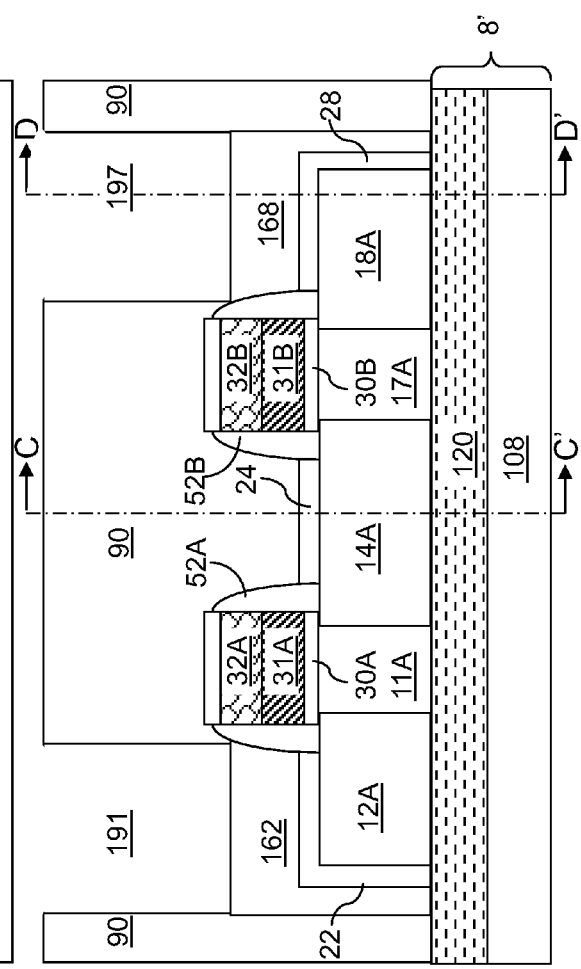
FIG. 14B is a vertical cross-sectional view of the second exemplary semiconductor structure of FIG. 14A along the plane B-B'.
Figure 14C:
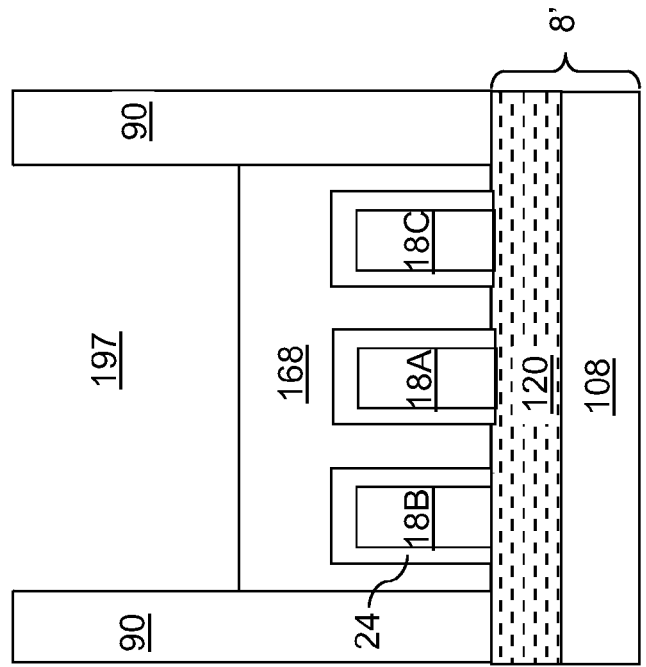
FIG. 14C is a vertical cross-sectional view of the second exemplary semiconductor structure of FIG. 14A along the plane C-C'.
Figure 14D:
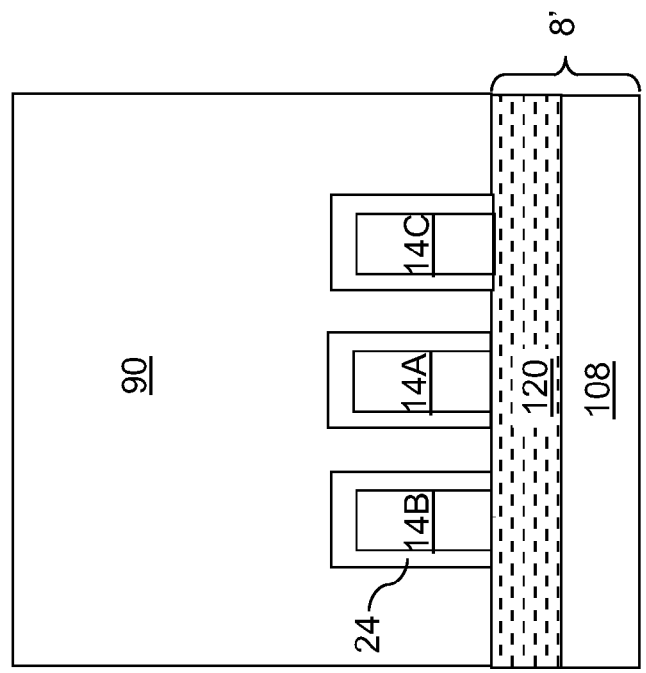
FIG. 14D is a vertical cross-sectional view of the second exemplary semiconductor structure of FIG. 14A along the plane D-D'.
Figure 15A:
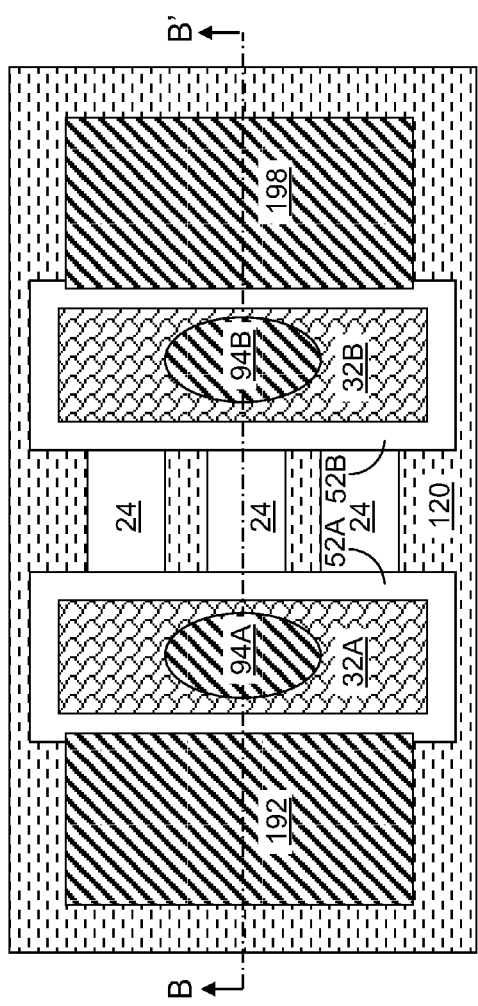
FIG. 15A is a top-down view of the second exemplary semiconductor structure after formation of metal semiconductor alloy regions and contact via structures according to the second embodiment of the present disclosure.
Figure 15B:
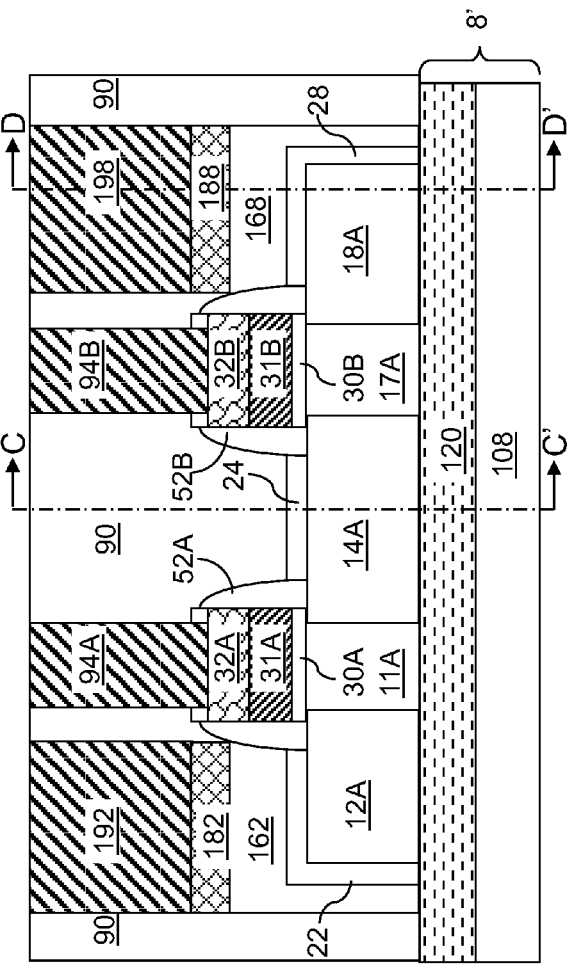
FIG. 15B is a vertical cross-sectional view of the second exemplary semiconductor structure of FIG. 15A along the plane B-B'.
Figure 15D:
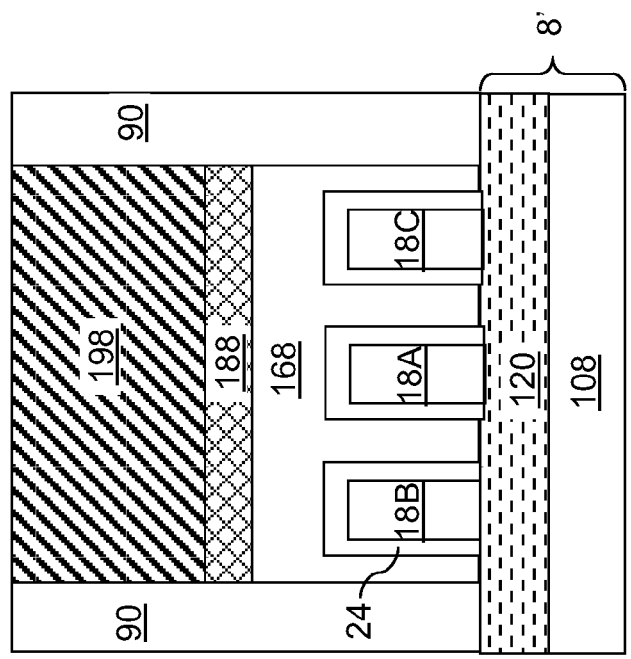
FIG. 15D is a vertical cross-sectional view of the second exemplary semiconductor structure of FIG. 15A along the plane D-D'.
Figure 15C:
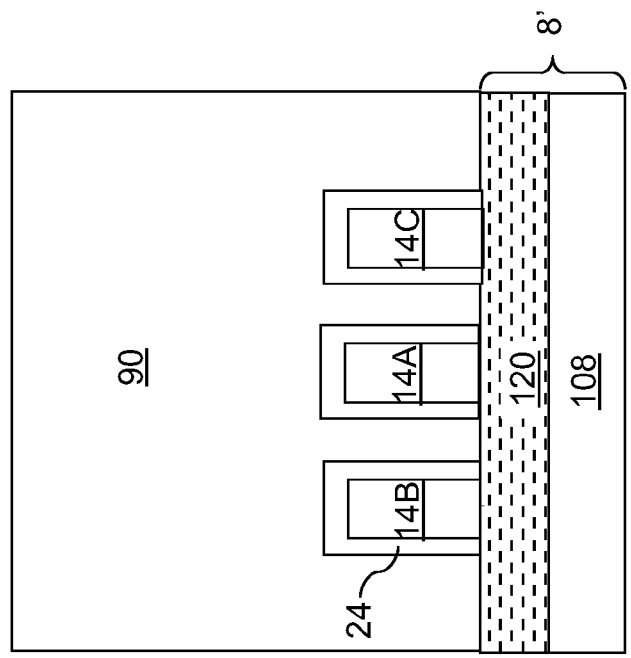
FIG. 15C is a vertical cross-sectional view of the second exemplary semiconductor structure of FIG. 15A along the plane C-C'.

Referring to FIG. 9, gate contact via holes are formed over gate stacks (30A, 31A, 32A, 38A, 30B, 31B, 32B, 38B, 30C, 31C, 32C, 38C), for example, by applying and patterning a photoresist layer (not shown) and transferring the pattern into the at least one contact-level dielectric layer 90. The photoresist layer is subsequently removed, for example, by ashing. Various contact via structures are formed in the remaining portions of the various contact via holes (91, 97) and in the newly formed gate contact via holes by depositing a conductive material within the various contact via holes (91, 97) over source/drain regions and within the gate contact via holes, and subsequently removing excess conductive material from above the planar top surface of the at least one contact-level dielectric layer 90. The conductive material can be, for example, W, Al, Cu, Ta, Ti, WN, TaN, TiN, or combinations thereof. The conductive material can be deposited, for example, by physical vapor deposition (PVD), chemical vapor deposition (CVD), electroplating, electroless plating, or a combination thereof. The excess conductive material can be removed, for example, by chemical mechanical planarization (CMP). The various contact via structures can include, for example, a first source/drain contact via structure 92, a second source/drain contact via structure 98, a first gate contact via structure 94A, a second gate contact via structure 94B, and a third gate contact via structure 94C.

Each of the source/drain contact via holes (91, 97) illustrated in FIG. 5 is filled with a stack including, from bottom to top, an upper raised source/drain region (62 or 68) in contact with a lower raised source/drain region (22 or 28), a source/drain metal semiconductor alloy portion (82 or 88), and a contact via structure (92 or 98) embedded within the at least one contact-level dielectric layer 90. The upper raised source/drain region (62 or 68) has a same horizontal cross-sectional area as a bottom portion of the overlying contact via structure (92 or 98).

Referring to FIGS. 10A-10D, a second exemplary semiconductor structure according to a second embodiment of the present disclosure includes a substrate 8', at least one semiconductor fin formed thereupon, at least one gate stack, and at least one gate spacer.

The substrate 8' includes a handle substrate 108 that provides mechanical support to the second exemplary structure and an insulator layer 120, which can include silicon oxide, silicon nitride, silicon oxynitride, glass, sapphire, or any other insulating material. Alternately, insulator layer 120 may be omitted. In this case, the handle substrate 108 can include an insulator material or a semiconductor material. In one embodiment, the at least one semiconductor fin and the handle substrate 108 can include a single crystalline semiconductor material that extends throughout the at least one semiconductor fin and the handle substrate to provide a bulk finFET.

In one embodiment, the at least one semiconductor fin can include a plurality of semiconductor fins. In an illustrative example, the plurality of semiconductor fins can include a first semiconductor fin 101A, a second semiconductor fin 101B, and a third semiconductor fin 101C. In one embodiment, the plurality of semiconductor fins (101A, 101B, 101C) can be formed by providing a semiconductor-on-insulator (SOI) substrate including the insulator layer 120 as a buried insulator layer and a top semiconductor layer including a first semiconductor material and having the same thickness as the thickness of the at least one semiconductor fin (101A, 101B, 101C), and by lithographically patterning the top semiconductor layer. The height of the at least one semiconductor fin (101A, 101B, 101C) can be from 10 nm to 200 nm, although lesser and greater heights can also be employed. The width of each of the at least one semiconductor fin (101A, 101B, 101C) can be from 5 nm to 30 nm, although lesser and greater widths can also be employed. The first semiconductor material of the second embodiment can be selected from the same group of semiconductor materials that can be employed for the first semiconductor material of the first embodiment.

Each of the at least one gate stack includes a gate dielectric and a gate conductor. The at least one gate stack can be formed by depositing gate stack layers over the substrate 8' and the at least one semiconductor fin (101A, 101B, 101C), and lithographically patterning the gate stack layer. The gate stack layers can include a stack, from bottom to top, of a gate dielectric layer, a gate conductor layer, and optionally, a gate cap dielectric layer. The gate stack layers are deposited as unpatterned planar layers. Subsequently, the at least one gate stack is formed by patterning the gate stack layers. For example, the gate stack layers can be patterned by an anisotropic etch process employing a patterned photoresist (not shown) as a masking layer to form gate stacks, each including a gate dielectric, a gate conductor, and optionally, a gate cap dielectric.

For example, a first gate stack and a second gate stack can be provided. The first gate stack can include a first gate dielectric 30A, a first lower gate conductor portion 31A, a first upper gate conductor portion 32A, and a first gate cap dielectric 38A. The second gate stack can include a second gate dielectric 30B, a second lower gate conductor portion 31B, a second upper gate conductor portion 32B, and a second gate cap dielectric 38B.

The gate dielectric layer, and consequently, each of the first and second gate dielectrics (30A, 30B, 30C), of the second embodiment can include, and can have the same thickness as, the gate dielectric layer of the first embodiment. The gate conductor layer can be a single layer or a plurality of layers. The gate conductor layer of the second embodiment can include, and can have the same thickness as, the gate conductor layer of the first embodiment. If a gate cap dielectric layer is formed, the gate cap dielectric layer, and consequently, the first and second gate cap dielectric portions (38A, 38B) derived therefrom, of the second embodiment can include, and can have the same thickness as, the gate cap dielectric layer of the first embodiment.

Each of a first gate electrode (31A, 32A) and a second gate electrode (31B, 32B) straddles over the at least one semiconductor fin (101A, 101B, 101C). The first semiconductor material of the at least one semiconductor fin (101A, 101B, 101C) can be undoped, or can be doped. If the at least one semiconductor fin (101A, 101B, 101C) is doped, the conductivity type of the first semiconductor material is herein referred to as a first conductivity type.

Referring to FIGS. 11A-11D, a selective deposition of a second semiconductor material is performed on physically exposed semiconductor surfaces of the second embodiment, while the second semiconductor material is not deposited on dielectric surfaces. The selectively deposited semiconductor material forms various raised source/drain regions. The various raised source/drain regions are herein referred to as lower raised source/drain regions in order to distinguish from additional raised source/drain regions to be subsequently formed. The various lower raised source/drain regions can include a first lower raised source/drain region 22 that is formed on one end of each semiconductor fin (101A, 101B, 101C; See FIGS. 10A-10D), a second lower raised source/drain region 24 that is formed between two gate spacers (52A, 52B) and on each semiconductor fin, and a third lower raised source/drain region 28 that is formed on the other end of each semiconductor fin.

The second semiconductor material of the second embodiment can be the same as the second semiconductor material of the first embodiment. In one embodiment, the second semiconductor material can be epitaxially aligned to the first semiconductor material of the at least one semiconductor fin.

The selectively deposited semiconductor material can be in-situ doped with dopants. If the first semiconductor material is doped with dopants of the first conductivity type, the selectively deposited semiconductor material is doped with dopants of a second conductivity type, which is the opposite of the first conductivity type. For example, if the first conductivity type is p-type, the second conductivity type is n-type, and vice versa. The dopants within each of the first lower raised source/drain region 22, the second lower raised source/drain region 24, and the third lower raised source/drain region 28 diffuse into underlying portions of a semiconductor fin (101A, 101B, 101C; See FIGS. 10A-10D) to form a doped region within that semiconductor fin. Thus, an underlying source/drain region is formed underneath each of the first, second, and third lower raised source/drain regions (22, 24, 28). The various underlying source/drain regions can include, for example, a first-fin first underlying source/drain region 12A, a first-fin second underlying source/drain region 14A, a first-fin third underlying source/drain region 18A, a second-fin first underlying source/drain region (not shown), a second-fin second underlying source/drain region 14B, a second-fin third underlying source/drain region 18B, a third-fin first underlying source/drain region (not shown), a third-fin second underlying source/drain region 14B, and a third-fin third underlying source/drain region 18B.

Alternately, the second semiconductor material can be deposited as an intrinsic semiconductor material, and can be subsequently doped by ion implantation. In this case, the implanted ions dope the selectively deposited semiconductor material to form a first lower raised source/drain region 22, a second lower raised source/drain region 24, and a third lower raised source/drain region 28 on each of the at least one semiconductor fin (101A, 101B, 101C; See FIGS. 10A-10D). Further, the implanted dopants dope portions of the at least one semiconductor fin that are not shielded by the gate stacks (30A, 31A, 32A, 38A, 30B, 31B, 32B, 38B) to form the various underlying source/drain regions, which can include, for example, a first-fin first underlying source/drain region 12A, a first-fin second underlying source/drain region 14A, a first-fin third underlying source/drain region 18A, a second-fin first underlying source/drain region (not shown), a second-fin second underlying source/drain region 14B, a second-fin third underlying source/drain region 18B, a third-fin first underlying source/drain region (not shown), a third-fin second underlying source/drain region 14B, and a third-fin third underlying source/drain region 18B.

Each portion of the at least one semiconductor fin that is not converted into any of the various underlying source/drain regions function as a body of a field effect transistor, and is herein referred to as a body region. The body regions can include, for example, a first-fin first body region 11A, a first-fin second body region 17A, a second-fin first body region (not shown), a second-fin second body region (not shown), a third-fin first body region (not shown), and a third-fin second body region (not shown). The first-fin first body region 11A, the second-fin first body, and the third-fin first body region underlie the first gate electrode (31A, 32A) and contact the first gate dielectric 30A. The first-fin second body region 17A, the second-fin second body, and the third-fin second body region underlie the first gate electrode (31A, 32A) and contact the first gate dielectric 30A.

At least one fin field effect transistor (finFET) is formed on each of the at least one semiconductor fin. The number of the at least one finFET depends on electrical wiring of the various source/drain therein. Each contacting pair of an underlying source/drain region (12A or equivalent, 14A, 14B, 14C, 18A, 18B, 18C) and a lower raised source/drain region (22, 24, 28) can function as a source/drain, i.e., as a source or a drain, of a field effect transistor. In one embodiment, multiple source/drains located on one lengthwise end of a plurality of semiconductor fins can be electrically shorted together, and multiple source/drains located on the other lengthwise end of the plurality of semiconductor fins can be electrically shorted together to form a composite finFET having multiple channels.

Each finFET further includes at least one body region (e.g., 11A, 17A) that is in contact with an underlying source/drain region (e.g., 12A, 14A, 18A). Each top surface and each lengthwise sidewall surface of each semiconductor fin include an interface between a lower raised source/drain region (22, 24, 28) and an underlying source/drain region (12A or equivalent, 14A, 14B, 14C, 18A, 18B, 18C). Each such interface is coplanar with a surface of a body region (e.g., 11A, 17A). Each gate electrode (31A, 32A, 31B, 32B) straddles over the at least one semiconductor fin. All underlying source/drain regions (12A and equivalent, 14A, 14B, 14C, 18A, 18B, 18C) and all body region of the finFET are located within one of the at least one semiconductor fin.

Referring to FIGS. 12A-12D, at least one contact-level dielectric layer 90 is formed over the various gate stacks and the various lower raised source/drain regions (22, 24, 28). The at least one contact-level dielectric layer 90 can include a dielectric material such as undoped silicon oxide, doped silicon oxide, silicon nitride, porous or non-porous organosilicate glass, porous or non-porous nitrogen-doped organosilicate glass, or a combination thereof. The at least one contact-level dielectric layer 90 can be deposited, for example, by chemical vapor deposition or spin-coating. If the top layer of the at least one contact-level dielectric layer 90 is not self-planarizing, the top surface of the at least one contact-level dielectric layer 90 can be planarized, for example, by chemical mechanical planarization.

Referring to FIGS. 13A-13D, a photoresist layer (not shown) is applied over the at least one contact-level dielectric layer 90, and is lithographically patterned to form various openings therein. The various openings overlie a portion of the various gate stacks or one of the lower raised source/drain regions (22, 24, 28).

The pattern in the photoresist layer is transferred through the at least one contact-level dielectric layer 90 and through the optional gate cap dielectric portions (38A, 38B), if present, to form various contact via holes within the at least one contact-level dielectric layer 90. The various contact via holes can include, for example, a first source/drain contact via hole 191, a second source/drain contact via hole 197. The first and second source/drain contact via holes (191, 197) extend from the planar top surface of the at least one dielectric layer a surface of a lower raised source/drain region (22, 28) through the at least one contact-level dielectric layer 90. An anisotropic etch having a chemistry that removes the dielectric materials of the at least one contact-level dielectric layer 90 and the optional gate cap dielectric portions (38A, 38B) selective to the second semiconductor material and the semiconductor material of the top portions of the gate electrodes (31A,32A, 31B, 32B) can be employed.

A top surface of the insulator layer 120 can be physically exposed at the bottom of each of the first and second source/drain contact via holes (191, 197). In one embodiment, the first and second source/drain contact via holes (191, 197) can overlie end portions of multiple semiconductor fins. For example, the first source/drain contact via hole 191 can overlie multiple first lower raised source/drain regions 22 located at end portions of multiple semiconductor fins, and the second source/drain contact via holes can overlie multiple third lower raised source/drain regions 28 located at other end portions of the multiple semiconductor fins. The photoresist layer is subsequently removed, for example, by ashing.

Referring to FIGS. 14A-14D, additional raised source/drain regions are formed at a bottom portion of the first and second source/drain contact via holes (191, 197) and directly on a physically exposed portions of the first and third lower raised source/drain regions (22, 28). The various additional raised source/drain regions are herein referred to as upper raised source/drain regions in order to distinguish from lower raised source/drain regions (22, 24, 28) that are previously formed.

The first and second upper raised source/drain regions (62, 68) are formed by selectively depositing a third semiconductor material. The third semiconductor material is deposited selectively only on semiconductor surfaces, and is not deposited on dielectric surfaces. The selectively deposited third semiconductor material forms various upper raised source/drain regions, which include a first upper raised source/drain region 162 that is formed directly on the first lower raised source/drain region(s) 22 and a second upper raised source/drain region 168 that is formed directly on the third lower raised source/drain region(s) 28.

The third semiconductor material can be the same as, or different from, the first semiconductor material and/or the second semiconductor material. The third semiconductor material can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the first and second upper raised source/drain regions (162, 168) is single crystalline.

During the selective deposition, the third semiconductor material is deposited only on exposed semiconductor surfaces while the third semiconductor material is not deposited on dielectric surfaces. The selective deposition can employ simultaneous or alternating steps of deposition and etch of the third semiconductor material. The deposition is effected by flowing a reactant gas including a precursor for the third semiconductor material in a processing chamber in which the first exemplary semiconductor structure is placed for processing. Exemplary precursors to the third semiconductor material include, but are not limited to, $SiH_4$, $Si_2H_6$, $SiH_2Cl_2$, $SiHCl_3$, $SiCl_4$, $GeH_4$, $Ge_2H_6$, $GeH_2Cl_2$, and other precursor materials for compound semiconductor materials as known in the art. The etch step, which can be performed simultaneously with or in alternation with the deposition step, is effected by flowing an etchant gas in the processing chamber. Exemplary etchants include, but are not limited to, HCl. The thickness of the first and second upper raised source/drain regions (162, 168) can be, for example, from 2 nm to 100 nm, although lesser and greater thicknesses can also be employed.

Each of the first and second upper raised source/drain regions (162, 168) can be formed with in-situ doping that is of the same conductivity type as the lower raised source/drain region (22 or 28) on which that first and second upper raised source/drain regions (162 or 168) is formed. If the first and third lower raised source/drain region (22, 28) are doped with dopants of different conductivity types, two separate selective epitaxy processes can be employed to provide different types of in-situ doping for the first and second upper raised source/drain regions (162, 168). Alternately, the first and second upper raised source/drain region (162, 168) can be formed as intrinsic semiconductor material portions, and can be subsequently doped with p-type dopants or n-type dopants by masked ion implantation.

In one embodiment, the various underlying source/drain regions (12, 14, 18) and the first and third lower raised source/drain region (22, 28) are single crystalline, and the selective deposition process can be a selective epitaxy process. In this case, each of the first and second upper raised source/drain regions (162, 168) is epitaxially aligned to one of the various underlying source/drain regions (12, 18) through a lower raised source/drain region (22, 28).

Each of the first and second upper raised source/drain regions (162, 168) becomes an added component of a preexisting underlying source or a preexisting underlying drain. Thus, the source or drain that includes the combination of the first underlying source/drain region 12 and the first lower raised source/drain region 22 is modified to further include the first upper raised source/drain region 62, and the source or drain that includes the combination of the third underlying source/drain region 16 and the third lower raised source/drain region 28 is modified to include the second upper raised source/drain region 68.

Because the surfaces of the second lower raised source/drain regions (24, 26) are not physically exposed during the selective deposition, no material is deposited on the second lower raised source/drain region (24, 26).

In one embodiment, each of the first and second upper raised source/drain regions (162, 168) is epitaxially aligned to a lower raised source/drain region, i.e., one of the first and third lower raised source/drain regions (22, 28) and to an underlying source/drain region, i.e., one of the first and third underlying source/drain regions (12, 18). Each upper raised source/drain region (162, 168) is formed directly on a lower raised source/drain region (22, 28). Each upper raised source/drain region (162, 168) is formed by selective deposition of the third semiconductor material. The third semiconductor material does not grow on dielectric surfaces during the selective deposition.

In one embodiment, a fin field effect transistor, such as a first fin field effect transistor including the first gate stack (30A, 31A, 32A, 38A) and a second fin field effect transistor including the second gate stack (30B, 31B, 32B, 38B) can include a source and a drain such that one of the source and the drain, which is herein referred to as a first source/drain, includes a combination of an underlying source/drain region (12 or 18), a lower raised source/drain region (22 or 28), and an upper raised source/drain region (162 or 168), and the other of the source and the drain, which is herein referred to as a second source/drain, includes a combination of another source/drain region 14 and another lower raised source/drain region 24 and does not include any upper raised source/drain region. All surfaces of the second lower raised source/drain region 24 of the second source/drain is in contact with a second underlying source/drain region 14 or the at least one contact-level dielectric layer 90 or the shallow trench isolation structure 20, i.e., the portion of the shallow trench isolation structure 20 that underlies that second underlying source/drain region 14.

In one embodiment, the first and/or second contact vie holes (191, 197) overlies a plurality of first lower raised source/drain regions 22 or a plurality of third lower raised source/drain regions 28. In this case, the first upper raised source/drain region 162 filling a bottom portion of the first contact via hole 191 can contact each of the plurality of first lower raised source/drain regions 22 and a top surface of the insulator layer 120 at a bottom of the first contact via hole 191. Likewise, the second upper raised source/drain region 168 filling a bottom portion of the first contact via hole 197 can contact each of the plurality of third lower raised source/drain regions 28 and a top surface of the insulator layer 120 at a bottom of the second contact via hole 197.

Referring to FIGS. 15A-15D, a metal semiconductor alloy portions can be optionally formed on physically exposed semiconductor surfaces at the bottom of each contact via hole (191, 197). The metal semiconductor alloy portions can include, for example, a first source/drain metal semiconductor alloy portion 182, and a second source/drain metal semiconductor alloy portion 188.

The first and second metal semiconductor alloy portions (182, 188) include an alloy of a metal provided by a temporary metal layer and the semiconductor material of the first and second upper raised source/drain regions (162, 168). The various metal semiconductor alloy portions (182, 188,) can be formed employing the same processing steps as in the first embodiment.

Each of the first and second source/drain metal semiconductor alloy portions (182, 188) is in contact with an upper raised source/drain region (162 or 168). The bottom surface of each of the first and second source/drain metal semiconductor alloy portions (182, 188) has the same area as the top surface of the upper raised source/drain region (162, 168) that is in contact with that source/drain metal semiconductor alloy portions (182 or 188).

Gate contact via holes are formed over gate stacks (30A, 31A, 32A, 38A, 30B, 31B, 32B, 38B), for example, by applying and patterning a photoresist layer (not shown) and transferring the pattern into the at least one contact-level dielectric layer 90. The photoresist layer is subsequently removed, for example, by ashing. Various contact via structures are formed within the remaining portions of the various contact via holes (191, 197) over the source/drain regions and within the gate contact via holes by depositing a conductive material within the various contact via holes (191, 197), and subsequently removing excess conducive material from above the planar top surface of the at least one contact-level dielectric layer 90.

The same processing steps can be formed as in the first embodiment to form the various contact via structures. The various contact via structures can include, for example, a first source/drain contact via structure 192, a second source/drain contact via structure 198, a first gate contact via structure 94A, and a second gate contact via structure 94B.

Each of the source/drain contact via holes (191, 197) illustrated in FIGS. 13A-13D is filled with a stack including, from bottom to top, an upper raised source/drain region (162 or 168) in contact with a lower raised source/drain region (22 or 28), a source/drain metal semiconductor alloy portion (182 or 188), and a contact via structure (192 or 198) embedded within the at least one contact-level dielectric layer 90. The upper raised source/drain region (162 or 168) has a same horizontal cross-sectional area as a bottom portion of the overlying contact via structure (192 or 198).

In one embodiment, the at least one semiconductor fin is a plurality of semiconductor fins, and each upper raised source/drain region, such as the first and second upper raised source/drain region (162, 168), is formed directly on a plurality of lower raised source/drain regions, such as a plurality of the first lower raised source/drain regions 22 or a plurality of second lower raised source/drain regions 28, that includes that lower raised source/drain region. A contact via structure, such as the first source/drain contact via structure 192 or the second source/drain contact via structure 198, is formed over a plurality of lower raised source/drain regions (22 or 28).

Within each of the first and second source/drain contact via holes, a stack, from bottom to top, of an upper raised source/drain region (162 or 168), a metal semiconductor alloy portion (182 or 188), and a contact via structure (192 or 198) is formed. The bottom surface of each metal semiconductor alloy portion (182, 188) has a same area as the top surface of the underlying upper raised source/drain region (162, 168). Each upper raised source/drain region (182 or 188) has a same horizontal cross-sectional area as the bottom portion of the overlying contact via structure (192 or 198). In one embodiment, the at least one semiconductor fin is a plurality of semiconductor fins, and an upper raised source/drain region (162, 168) is in contact with a plurality of lower raised source/drain regions (22 or 28).

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A semiconductor structure including a field effect transistor (FET), said semiconductor structure comprising:
 an underlying source/drain region;
 a lower raised source/drain region located on said underlying source/drain region;
 at least one contact-level dielectric layer overlying said lower raised source/drain region; and
 a stack comprising an upper raised source/drain region in contact with said lower raised source/drain region and a contact via structure embedded within said at least one contact-level dielectric layer, wherein said upper raised source/drain region has a same horizontal cross-sectional area as a bottom portion of said contact via structure.

2. The semiconductor structure of claim 1, wherein said FET further comprises a body region that is in contact with said underlying source/drain region, and an interface between said lower raised source/drain region and said underlying source/drain region is coplanar with a surface of said body region.

3. The semiconductor structure of claim 1, wherein said FET further comprises:
a body region in contact with said underlying source/drain region;
another underlying source/drain region in contact with said body region; and
another lower raised source/drain region located on said another underlying source/drain region, wherein all surfaces of said another lower raised source/drain region are in contact with said another underlying source/drain region or said at least one contact-level dielectric layer or a shallow trench isolation structure.

4. The semiconductor structure of claim 1, wherein said stack further comprises a metal semiconductor alloy portion in contact with said upper raised source/drain region and said contact via structure.

5. The semiconductor structure of claim 1, wherein a bottom surface of said metal semiconductor alloy portion has a same area as a top surface of said upper raised source/drain region.

6. The semiconductor structure of claim 1, wherein said upper raised source/drain region is epitaxially aligned to said lower raised source/drain region and to said underlying source/drain region.

7. The semiconductor structure of claim 1, wherein said upper raised source/drain region of said FET further comprises another source/drain region, one of said source/drain region and said another source/drain region is a source region of said FET, and another of said source/drain region and said another source/drain region is a drain region of said FET.

8. The semiconductor structure of claim 1, wherein said FET is a planar FET, and a surface of said underlying source/drain region is coplanar with an interface between a gate dielectric and a body region of said FET.

9. The semiconductor structure of claim 8, wherein said underlying source/drain region, said lower raised source/drain region, and said upper raised source/drain region collectively constitute one of a source and a drain of said FET, and another of said source and said drain of said FET does not extend above a plane of an interface between said lower raised source/drain region and said upper raised source/drain region.

10. The semiconductor structure of claim 1, wherein said FET is a fin FET including at least one semiconductor fin and a gate electrode straddling over said at least one semiconductor fin, and said underlying source/drain region and a body region are located within one of said at least one semiconductor fin.

11. The semiconductor structure of claim 10, wherein said at least one semiconductor fin is a plurality of semiconductor fins, said upper raised source/drain region is in contact with a plurality of lower raised source/drain regions including said lower raised source/drain region, and said contact via structure overlies said plurality of lower raised source/drain regions.

12. A method of forming a semiconductor structure comprising:
forming a field effect transistor (FET) comprising at least an underlying source/drain region and a lower raised source/drain region on at least one semiconductor portion;
forming at least one contact-level dielectric layer over said field effect transistor;
forming a contact via hole extending to a surface of said lower raised source/drain region through said at least one contact-level dielectric layer; and
forming an upper raised source/drain region at a bottom portion of said contact via hole.

13. The method of claim 12, wherein said upper raised source/drain region is formed directly on said lower raised source/drain region.

14. The method of claim 12, wherein said upper raised source/drain region is formed by selective deposition of a semiconductor material, wherein said semiconductor material does not grow on dielectric surfaces during said selective deposition.

15. The method of claim 12, wherein said upper raised source/drain region is epitaxially aligned to said lower raised source/drain region and said underlying source/drain region.

16. The method of claim 12, further comprising forming a contact via structure in an upper portion of said contact via hole, wherein said upper raised source/drain region has a same horizontal cross-sectional area as a bottom portion of said contact via structure.

17. The method of claim 12, further comprising forming a metal semiconductor alloy portion directly on said underlying source/drain region and within said contact via hole.

18. The method of claim 12, wherein said FET is a planar FET, and a surface of said underlying source/drain region is coplanar with an interface between a gate dielectric and a body region of said FET.

19. The method of claim 12, wherein said FET is a fin FET including at least one semiconductor fin and a gate electrode straddling over said at least one semiconductor fin, and said underlying source/drain region and a body region of said FET are formed within one of said at least one semiconductor fin.

20. The method of claim 19, wherein said at least one semiconductor fin is a plurality of semiconductor fins, said upper raised source/drain region is formed directly on a plurality of lower raised source/drain regions including said lower raised source/drain region, and said method further comprises forming a contact via structure over said plurality of lower raised source/drain regions.

* * * * *